(12) United States Patent
Nakaharada et al.

(10) Patent No.: US 8,441,618 B2
(45) Date of Patent: May 14, 2013

(54) SUBSTRATE TRANSFER METHOD AND APPARATUS

(75) Inventors: Masahiro Nakaharada, Koshi (JP); Naruaki Iida, Koshi (JP); Katsuhiro Morikawa, Koshi (JP); Suguru Enokida, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 387 days.

(21) Appl. No.: 12/820,417

(22) Filed: Jun. 22, 2010

(65) Prior Publication Data

US 2010/0321648 A1 Dec. 23, 2010

(30) Foreign Application Priority Data

Jun. 22, 2009 (JP) ................. 2009-148099

(51) Int. Cl.
*B65H 1/00* (2006.01)
*G03B 27/32* (2006.01)
*G03B 27/42* (2006.01)
*G03B 27/58* (2006.01)

(52) U.S. Cl.
USPC .............. 355/77; 355/27; 355/53; 355/72

(58) Field of Classification Search .......... 355/27, 355/53, 72, 77; 414/222.07, 222.12, 226.05, 414/806, 935–941; 901/30, 40
See application file for complete search history.

(56) References Cited

U.S. PATENT DOCUMENTS

| 5,664,254 A * | 9/1997 | Ohkura et al. ............. 396/612 |
| 2006/0120833 A1* | 6/2006 | Bonora et al. ............. 414/217 |
| 2009/0098298 A1 | 4/2009 | Miyata et al. |
| 2011/0262623 A1 | 10/2011 | Miyata et al. |

FOREIGN PATENT DOCUMENTS

| jp | 2001-035900 A1 | 2/2001 |
| JP | 2008-289312 A1 | 11/2008 |
| JP | 2009-021504 A1 | 1/2009 |
| JP | 2009-099577 A1 | 5/2009 |
| WO | 2009/037673 A2 | 3/2009 |

OTHER PUBLICATIONS

Japanese Office Action dated Jun. 11, 2012 (with English translation).
Japanese Office Action, Japanese Application No. 2009-148099, dated Nov. 13, 2012 (2 pages).

* cited by examiner

*Primary Examiner* — Hung Henry Nguyen
*Assistant Examiner* — Colin Kreutzer
(74) *Attorney, Agent, or Firm* — Burr & Brown

(57) ABSTRACT

A substrate transfer apparatus, for transferring a substrate from a first module to a second module, includes a moving base having a Y-motion axis for moving the moving base in Y-direction, and a substrate holding member mounted to the moving base via X-motion axis so as to move relative to the moving base to be in an advanced position and a retracted position relative to the moving base. The X-motion axis operates when the Y-motion axis is operating, if the X-motion axis must be parallel to the Y-motion axis when transferring the substrate from the substrate holding member to the second module.

8 Claims, 17 Drawing Sheets

SUBSTRATE TRANSFER METHOD AND APPARATUS

BACKGROUND OF THE INVENTION

1. Field of the Invention

The present invention relates to a substrate transfer technique for transferring a substrate between modules.

2. Description of Related Art

In a photolithography process as one of the semiconductor manufacturing processes, a resist pattern is formed by applying a resist to the surface of a semiconductor wafer (hereinafter referred to as "wafer"), by exposing the resist with a predetermined pattern, and by developing the exposed resist. Such a process is generally performed by using a system comprising a coating and developing apparatus configured to perform resist application and development and an exposure apparatus connected to the coating and developing apparatus.

The coating and developing apparatus includes resist coating modules each configured to apply a resist onto a wafer, and developing modules each configured to supply a developing solution to the wafer, and further includes heating modules each configured to heat a wafer before or after processed in the resist coating modules and the developing modules. Between the respective modules, and between the coating and developing apparatus and the exposure apparatus, wafers are transferred by substrate transfer units each provided with an arm.

An example of the conventional substrate transfer unit is briefly described with reference to FIG. 14. In FIG. 14, the reference number 101 depicts a guide; the reference number 102 depicts a frame capable of horizontal movement; the reference number 103 depicts an elevating table; and the reference number 104 depicts a rotating table. The reference number 105 depicts arms each for holding a wafer W capable of moving forward (advancing) and rearward (retracting) with respect to the rotating table 104. Thus, the substrate transfer unit 100 shown in FIG. 14 has a four-axis structure including moving mechanisms for linear motion along a horizontal motion axis (Y-axis), for linear motion along a vertical motion axis (Z-axis), for rotating motion about a rotational axis (θ-axis), and for linear motion along a substrate transfer axis (X-axis). The assembly comprising the frame 102, the elevating table 103, and the rotating table 104, which moves the arms 105 between the modules, is referred to as "moving part 110".

In one example, modules 108 and 109 are located at different heights as shown in FIG. 14. When a wafer W is transferred between these modules 108 and 109, the frame 102, the elevating table 103, and the rotating table 104 are operated such that the arm 105 is positioned to face one of the modules in front of that module. Thereafter, the advancing motion of the arm 105 toward the module is started, and the wafer W is transferred between the module and the arm 105.

The frame 102, the elevating table 103, and the rotating table 104 may be operated in different time frames. They, however, are simultaneously operated in order to improve throughput. In the graph shown in FIG. 15, the abscissa axis indicates time passage; and arrows respectively indicate the motion periods of motion axes of the substrate transfer unit 100. FIGS. 16(*a*), 16(*b*), 16(*c*) and 16(*d*) respectively show transfer states of the wafer W at time points E1, E2, E3 and E4 in the graph. FIGS. 17(*a*), 17(*b*), 17(*c*) and 17(*d*) respectively show the position of the arm 105 with the rotating table 104 in the corresponding FIGS. 16(*a*), 16(*b*), 16(*c*) and 16(*d*). Herein, the movement of the moving part 110 from a position in front of the transfer-departure module 108 to a position in front of the transfer-destination module 109 is referred to as "intermodular travel", and the advancing motion of the arm 105 is referred to as "substrate transfer motion".

During the intermodular travel, if all axis motions are performed at their maximum speeds, the time required for Y-axis motion (i.e., horizontal motion of the frame 102) is longest. As shown by the dotted arrows in FIG. 15, the time required for the Z-axis motion (i.e., vertical motion of the elevating table 103) and the time required for the θ-axis motion (i.e., rotating motion of the rotating table 104) are shorter than the time required for the Y-axis motion. However, as described above, since the substrate transfer motion (X-axis motion) is performed after the completion of the intermodular travel, the motion speed of the Z-axis motion and the motion speed of the θ-axis motion need not set so high. Thus, the motion speeds of the Z-axis motion and the θ-axis motion are set lower than their highest possible speeds such that the Z-axis motion and the θ-axis motion are both finished at the time when the Y-axis motion is finished, i.e., concurrently with the elapse of time t1 from the start of the Y-axis motion. Thus, if the advancing motion (i.e., X-axis motion; substrate transfer motion of the arm 105) requires time t2, the time equivalent to the sum of time t1 and time t2 is required to complete the intermodular travel and the substrate transfer motion. However, further improvement in throughput is desired for the aforementioned coating and developing apparatus.

SUMMARY OF THE INVENTION

The present invention provides a technique for increasing the speed at which a substrate is transferred between modules, thereby improving a throughput.

The present invention provides a method of transferring a substrate between a first module and a second module using a substrate transfer apparatus, wherein, in plan view, the first and second modules both face a transfer path, the transfer path extends substantially linearly, and the second module is located on an imaginary extension of the transfer path, and wherein the substrate transfer apparatus includes: a moving base configured to move along the transfer path; and a substrate holding member mounted to the moving base so as to move relative to the moving base to be in an advanced position and a retracted position relative to the moving base, said method comprising: transferring a substrate from the first module to the substrate holding member; moving the moving base along the transfer path toward the second module; advancing the substrate holding member relative to the moving base to place the substrate holding member in the advanced position; and transferring the substrate from the substrate holding member placed in the advanced position to the second module, wherein the advancing of the substrate holding member relative to the moving base is performed when the moving of the moving base along the transfer path toward the second module is being performed.

In one preferred embodiment, the method may further include: moving the moving base away from the second module along the transfer path, after completion of the transferring the substrate from the substrate holding member to the second module; and retracting the substrate holding member relative to the moving base when the moving of the moving member along the transfer path away from the second module is being performed.

In one preferred embodiment, the method may further include: rotating the substrate holding member or vertically moving the substrate holding member.

In one preferred embodiment, the method may further include: rotating the substrate holding member and vertically moving the substrate holding member, wherein the advancing of the substrate holding member relative to the moving base is performed after transferring the substrate from the first module to the substrate holding member, and after the later one of completion of the rotating of the substrate holding member and completion of the vertical moving of the substrate holding member.

The present invention further provides a method of transferring a substrate between a first module and a second module using a substrate transfer apparatus, wherein, in plan view, the first and second modules both face a transfer path, the transfer path extends substantially linearly in Y-direction, and the second module is located on an imaginary extension in the Y-direction of the transfer path, and wherein the substrate transfer apparatus includes: a moving base having a horizontal, Y-motion axis for moving the moving base in the Y-direction; and a substrate holding member mounted to the moving base via a horizontal, X-motion axis so as to move relative to the moving base to be in an advanced position and a retracted position relative to the moving base, said method comprising: transferring a substrate from the first module to the substrate holding member; moving the moving base toward the second module by operating the Y-motion axis; advancing the substrate holding member relative to the moving base by operating the X-motion axis, in order to place the substrate holding member in the advanced position; and transferring the substrate from the substrate holding member placed in the advanced position to the second module, wherein the operating of the X-motion axis is performed when the operating of the Y-motion axis is being performed, if the X-motion axis must be parallel to the Y-motion axis when transferring the substrate from the substrate holding member to the second module.

In one preferred embodiment, the substrate transfer apparatus may further include a θ-motion axis for moving the substrate holding member about a vertical axis, and said method may further include turning the substrate holding member by operating the θ-motion axis after the transferring of the substrate from the first module to the substrate holding member, so that the X-motion axis is oriented parallel to the Y-motion axis.

In one preferred embodiment, the advancing of the substrate holding member relative to the moving base by operating the X-motion axis is performed after completion of the turning of the substrate holding member by operating the θ-motion axis.

In one preferred embodiment, the substrate transfer apparatus may further include a θ-motion axis for moving the substrate holding member about a vertical axis, and a Z-motion axis for moving a substrate holding member vertically, and said method may further includes turning the substrate holding member by operating the θ-motion axis after the transferring of the substrate from the first module to the substrate holding member, so that the X-motion axis is oriented parallel to the Y-motion axis, and vertically moving the substrate holding member by operating the Z-motion axis after the transferring of the substrate from the first module to the substrate holding member, so that the substrate holding member located at the same level as the second module, wherein the operating of the X-motion axis is performed after the later one of completion of turning the substrate holding member by the θ-motion axis and completion of the vertical moving of the substrate holding member by the Z-motion axis.

The present invention also provides a storage medium for performing the aforementioned method, and a coating and developing apparatus employing the aforementioned substrate transfer apparatus configured to perform the aforementioned method.

DETAILED DESCRIPTION OF THE PRESENT INVENTION

First Embodiment

Figure 1:
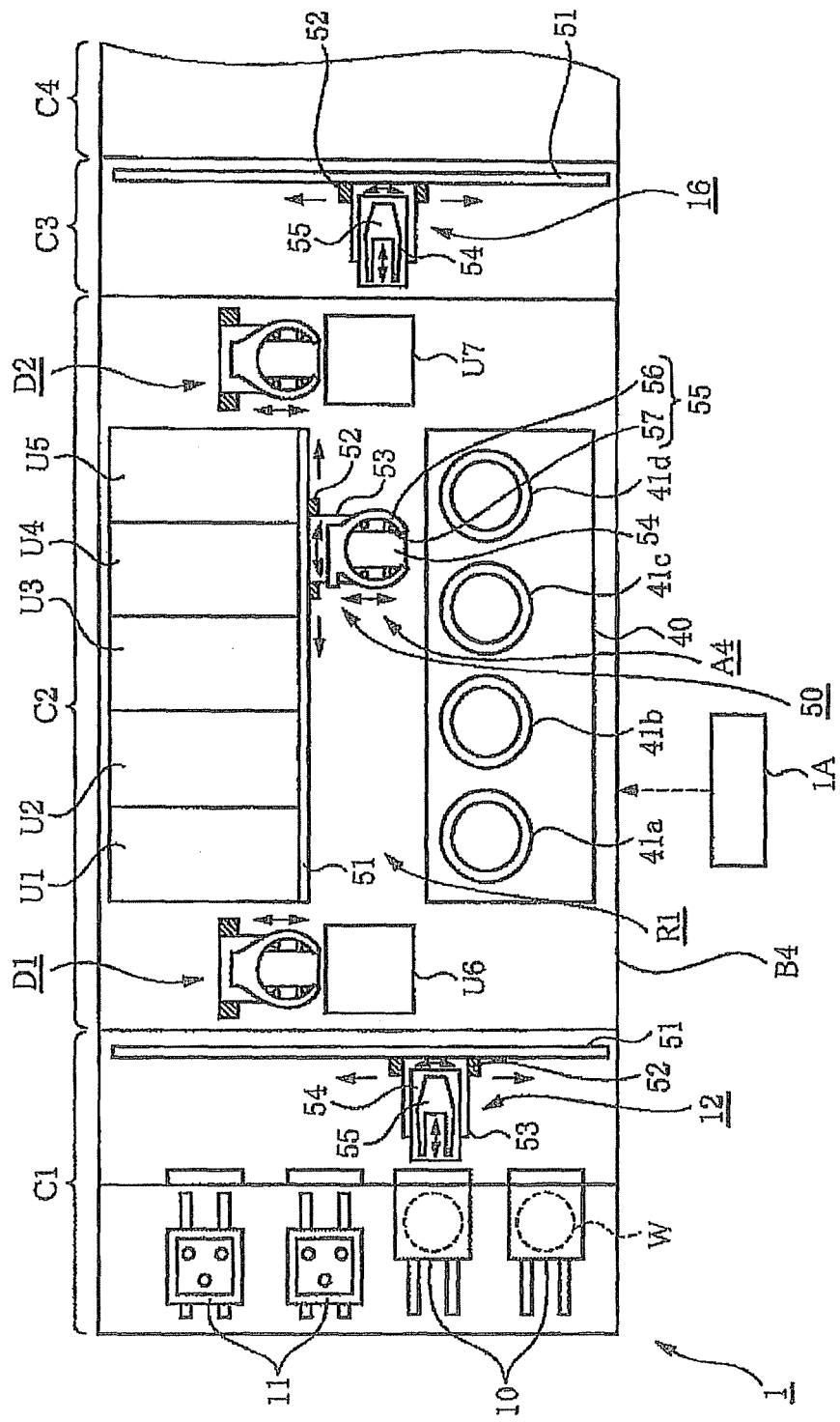
FIG. 1 is a plan view of a coating and developing apparatus including a substrate transfer apparatus in one embodiment of the present invention.
Figure 2:
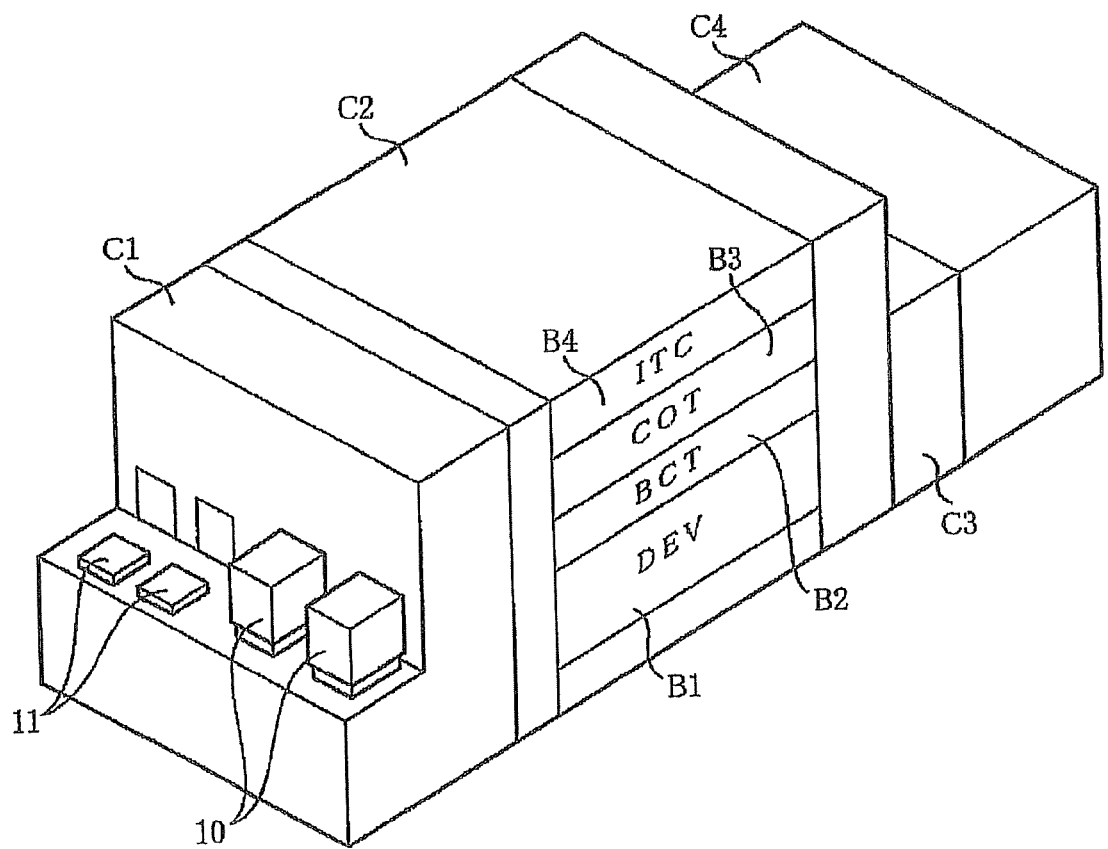
FIG. 2 is a perspective view of the coating and developing apparatus.
Figure 3:
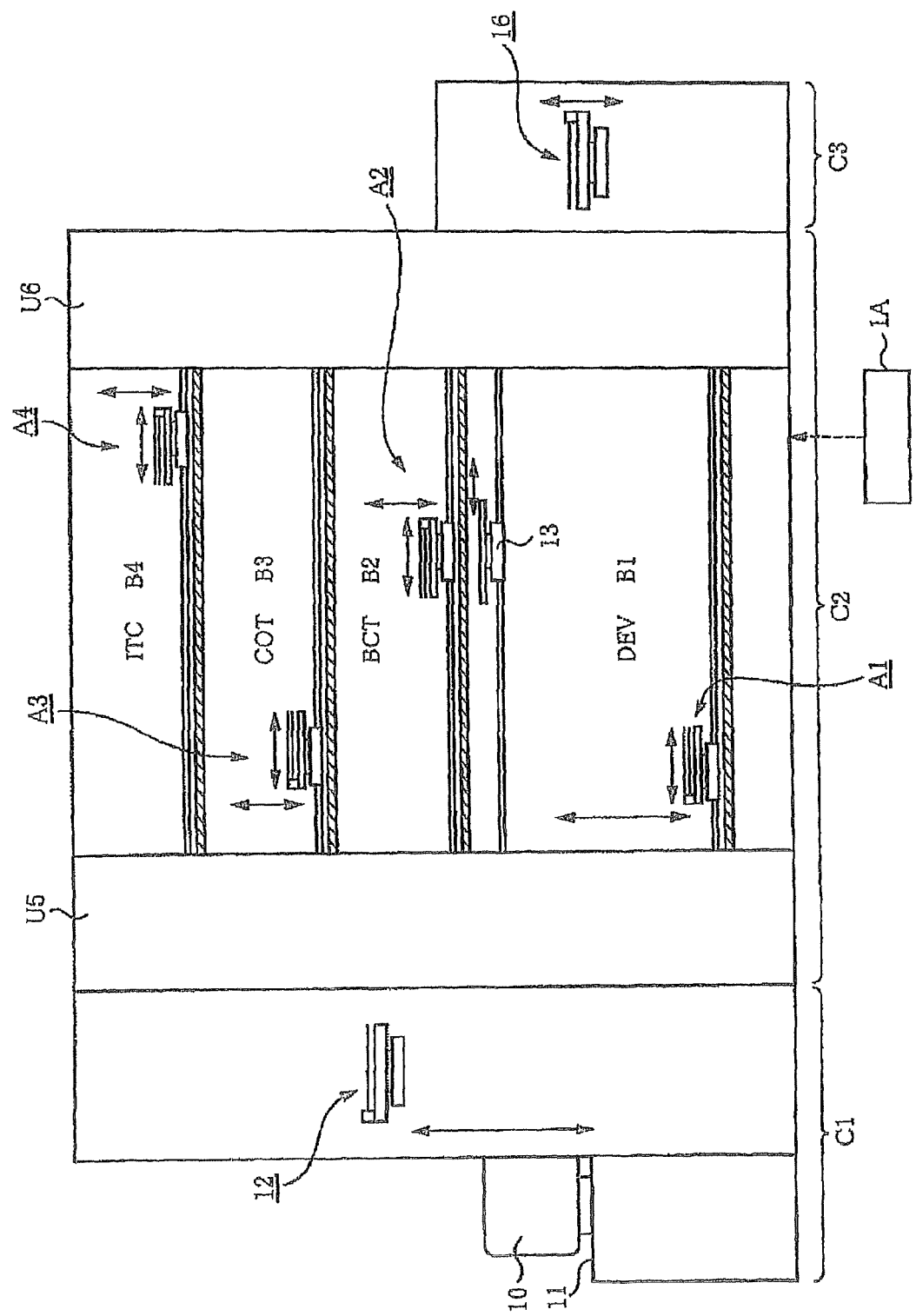
FIG. 3 is a longitudinal side view of the coating and developing apparatus.
Figure 4:
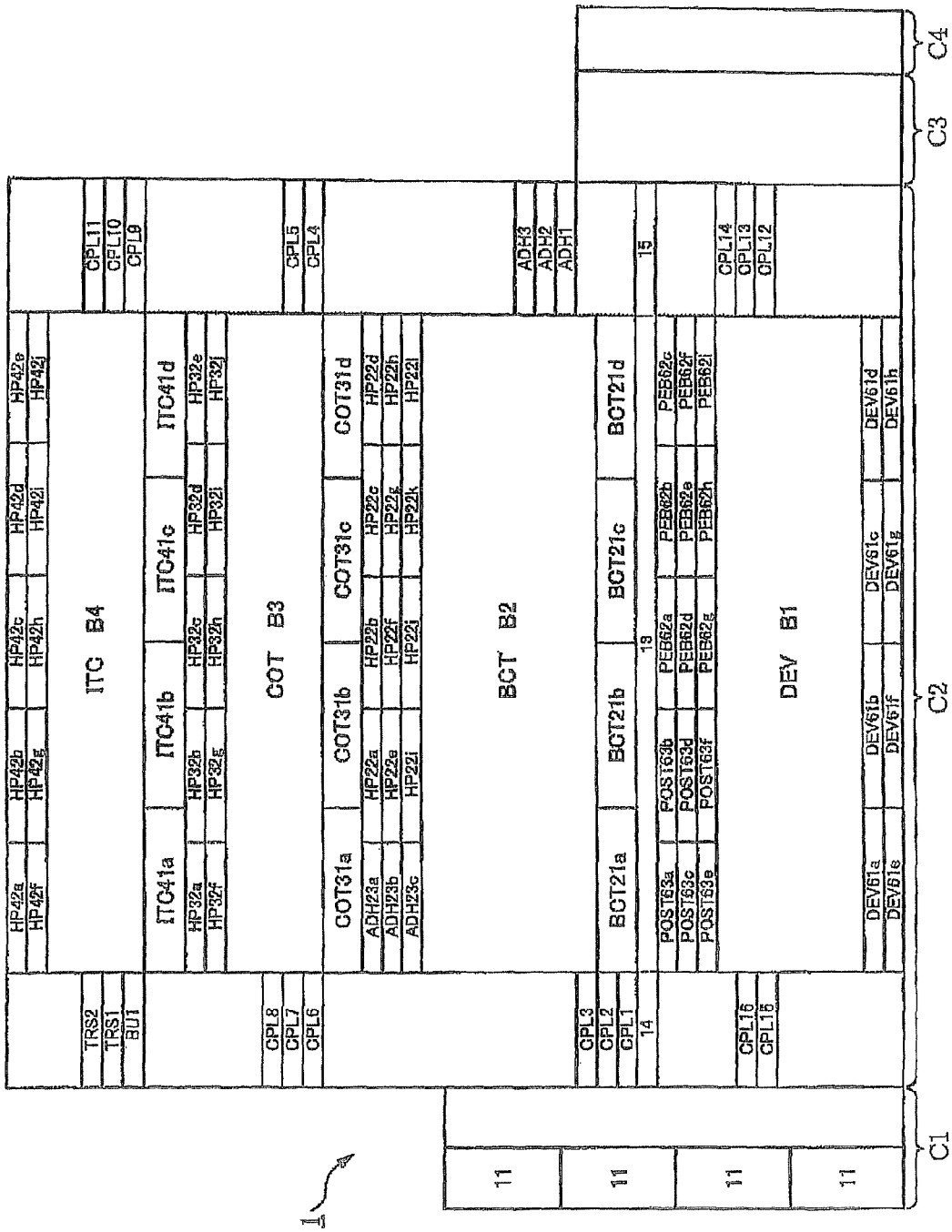
FIG. 4 is an expanded view showing an arrangement of modules of the coating and developing apparatus.

There will be described a coating and developing apparatus 1, which is equipped with a substrate transfer apparatus (substrate transfer unit) in one embodiment of the present invention. FIG. 1 is a plan view of a resist pattern forming system, which is constituted by connecting an exposure apparatus C4 to the coating and developing apparatus 1. FIG. 2 is a perspective view of the system. FIG. 3 is a vertical sectional view of the coating and developing apparatus 1. FIG. 4 is an expanded view showing a module arrangement in the coating and developing apparatus 1. Herein, any place in the coating and developing apparatus 1 on which a substrate (e.g., a wafer W) is placed may be referred to as "module".

The coating and developing apparatus 1 is provided with a carrier block C1 having stages 11. A wafer transfer unit 12 is configured to take a wafer W out of a hermetic carrier 10 placed on the stage 11, and to convey the wafer W to a processing block B2. The wafer transfer unit 12 is also configured to receive a processed wafer W from the processing block C2, and to return the wafer W into the carrier 10.

As shown in FIG. 3, the processing block C2 is constituted by stacking a first block (DEV layer) B1 provided for a developing process, a second block (BCT layer) B2 provided for forming an antireflection film below a resist film, a third block (COT layer) B3 provided for forming a resist film, and a fourth block (ITC layer) B4 provided for forming a protective film above the resist film, in that order from below.

The respective layers of the processing block C2 have essentially the same structure, regarding the module/unit layout, in plan view. Herein, the fourth block (ITC layer) B4 is described by way of example. The ITC layer B4 includes a liquid processing section 40. The liquid processing section 40 is provided with chemical-liquid coating modules (ITCs) 41a to 41d each configured to apply a chemical liquid onto a resist film. The chemical liquid forms a water-repellent protective film for protecting the resist film. The ITC layer B4 further includes unit shelves U1 to U5, which are opposed to the liquid processing section 40 and arrayed from the side of the carrier block C1 to the side of an interface block C3. The unit shelves U1 to U5 include heating modules (HPs) 42a to 42j each having a heating plate for heating a wafer W placed thereon. Each of the unit shelves U1 to U5 is structured by stacking two of the heating molds (HP).

Figure 5:
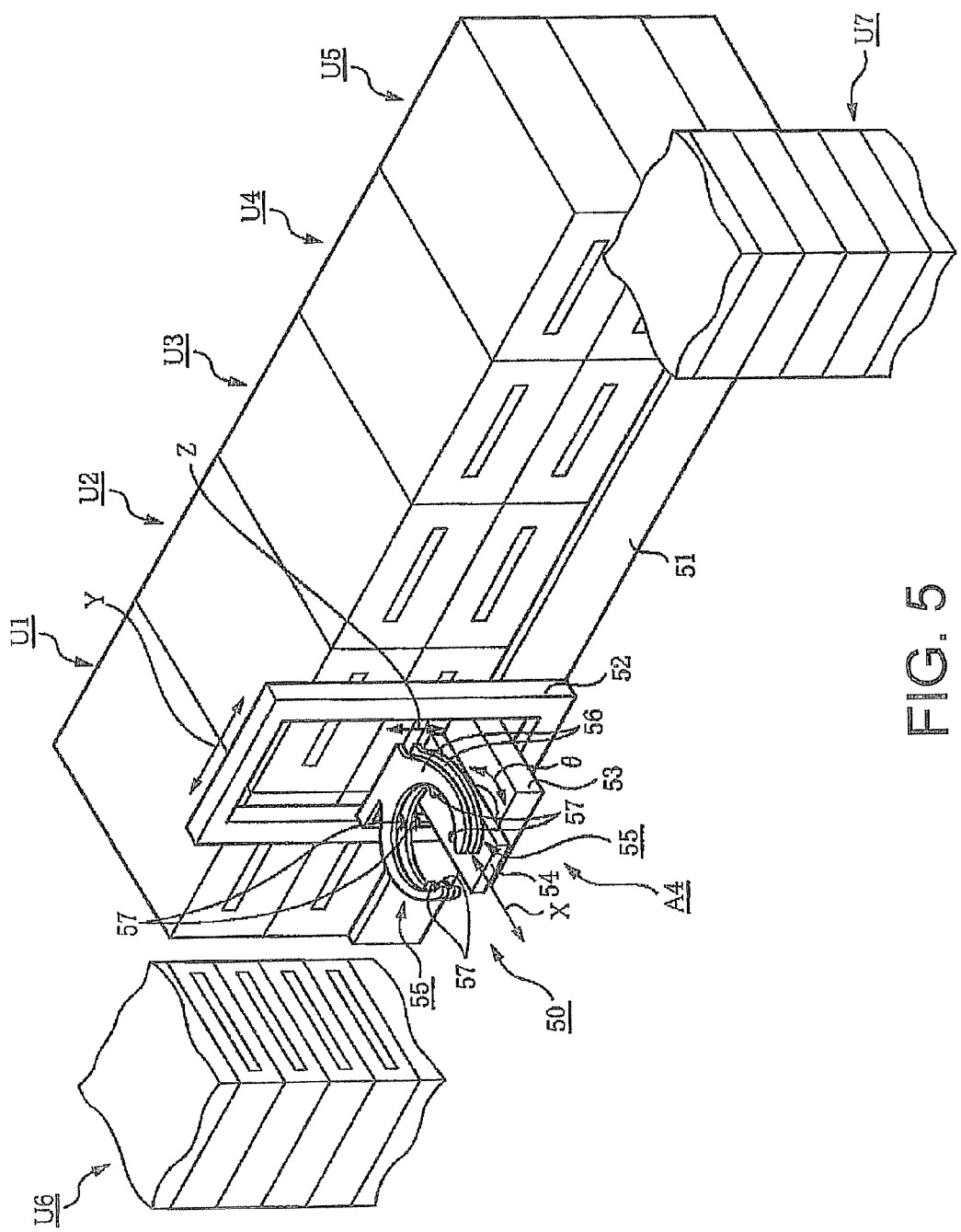
FIG. 5 is a perspective view of a wafer transfer unit provided in a processing block of the coating and developing apparatus.

The ITC layer B4 is provided with a wafer transfer unit A4. With reference to FIG. 5, the structure of the wafer transfer unit A4 is described. The wafer transfer unit A4 has a guide 51 extending horizontally from the side of the carrier block C1 to the side of the interface block C3. A frame 52 is provided to move along the guide 51. An elevating table 53 is provided on the frame 52 to move vertically along a vertical axis. A rotating table 54 is provided on the elevating table 53 to rotate about a vertical axis. The rotating table 54 has a drive unit, not shown, which is configured to horizontally move the arms 55, independently, forward and rearward.

FIG. 5 shows that the arm 55 is located on a retracted position for intermodular travel (travel between the modules). When a wafer W is transferred between the arm 55 and one of the modules, the arm 55 is moved to its forward position with respect to the rotating table 54. The arm 55 has a base portion 56 that surrounds the periphery of a wafer W, and supporting portions 57 that support the rear surface of the wafer W. As described above, the wafer transfer unit A4 is structured as a four-axis mechanism having four drive units for movements along a horizontal axis (Y-axis), movement along a vertical axis (Z-axis), movement about a rotational axis (θ-axis), and movement along a substrate transfer axis (X-axis), respectively. The assembly comprising the frame 52, the elevating table 53 and the rotating table 54 is referred to as "moving part 50" that moves the arms 55 for intermodular travel.

In plan view, a transfer area R1 having an elongated rectangle shape is defined between the array of the unit shelves U1 to U5 and the liquid processing section 40. The opposing longitudinal ends of the transfer area R1 are defined by unit shelves U6 and U7 described below, in other words, unit shelves U6 and U7 are located on a longitudinal, imaginary extension of the transfer area R1. The arms 55 move within the transfer area R1 so as to transfer wafers W among modules including: modules in the unit shelves U1 to U5, the chemical-liquid coating modules (ITCs) 41a to 41d, and modules in the unit shelves U6 and U7. Each module has transfer means comprising elevating pins (not shown). When the arm 55 of the wafer transfer unit A4 (or an arm of each transfer unit described below) enters a certain module, the elevating pins are raised and lowered, so that a wafer W is transferred between the arm and the module (in detail, a table, a stage, a chuck or the like where the wafer is placed within the module). Alternatively, the arm having entered the module may be raised and lowered, such that the wafer W is transferred between the arm and the module.

The third block (COT layer B3) is briefly described. Instead of the chemical-liquid coating modules (ITCs) 41a to 41d, a liquid processing section of the third block B3 is provided with resist coating modules (COTs) 31a to 31d each configured to apply a resist onto a wafer W. Unit shelves U1 to U5 include heating modules (HPs) 32a to 32j.

Next, the second block (BCT layer B2) is described. Instead of the chemical-liquid coating modules (ITCs) 41a to 41d, a liquid processing section of the second block B2 is provided with antireflection-film forming modules (BCTs) 21a to 21d each configured to apply a chemical liquid for forming an antireflection film. Unit shelves U1 to U5 include heating modules (HPs) 22a to 22l and hydrophobing modules (ADHs) 23a to 23c. The heating modules (HPs) 22a to 22l are each configured to heat a wafer W on which the chemical liquid has been applied. Each hydrophobing module (ADH) includes a heating plate for heating a wafer W placed thereon, and a gas supply mechanism for supplying a hydrophobing gas to the wafer W heated by the heating plate. The hydrophobing module (ADH) improves adhesion of a film to the wafer surface. The unit shelves U1 to U5 are each structured by stacking aforementioned modules at three levels. In one example of the operation of the apparatus mentioned later, the modules of the unit shelves U1 to U5 and the antireflection-film forming modules BCTs 21a to 21d are not used, and the second block 132 is used as a transfer passage along which a wafer W is transferred from the below-described unit shelf U6 to the unit shelf U7.

The first block (DEV layer) 131 is described. A liquid processing section of the first block B1 is composed of two stacked layers. Instead of the chemical-liquid coating modules (ITCs) 41a to 41d, the liquid processing part of the first block B1 is provided with developing modules (DEVs) 61a to 61h each configured to supply a developer to a wafer W so as to develop a resist film. Unit shelves U1 to U5 include heating modules (PEBs) 62a to 62i each configured to heat a wafer W that has been already exposed but is not yet developed, and heating modules (POSTs) 63a to 63f each configured to heat a developed wafer W. The respective unit shelves U1 to U5 are structured by stacking the aforementioned modules at three levels.

The unit shelf U6 is disposed in the processing block C2 on the side of the carrier block C1. In the unit shelf U6, there are stacked transfer modules TRS and CPL, a buffer module BU, and a wafer transfer part 14 provided to transfer a wafer W to and from a shuttle 13 (described below). The transfer module TRS includes a stage for placing a wafer W thereon; and the transfer module CPL includes a stage for placing a wafer W thereon and a temperature adjusting means for adjusting the temperature of the wafer W placed on the stage. The buffer module BU can accommodate therein a plurality of wafer W at vertical intervals. Disposed near the unit shelf U6 is a wafer transfer unit D1 having an arm that moves vertically to transfer a wafer W between modules included in the unit shelf U6.

The unit shelf U7 is disposed in the processing block C2 on the side of the interface block C3. In the unit shelf U7, there are stacked a transfer module CPL, a hydrophobing module ADH, and a wafer transfer part 15 provided to transfer a wafer W from the shuttle 13 to the interface block C3. Disposed near the unit shelf U7 is a wafer transfer unit D2 having an arm that moves vertically to transfer a wafer W between the modules included in the unit shelf U7. The shuttle 13 is disposed on an upper part in the DEV layer B1. The shuttle 13 transfers a wafer W directly from the transfer part 14 of the unit shelf U6 to the transfer part 15 of the unit shelf U7. Although many transfer modules TRS and CPL and the buffer modules BU are disposed in the unit shelves U6 and U7, FIG. 4 shows only the modules used in one example of the transfer operation described later.

The interface block C3 is provided with a wafer transfer unit 16 to transfer a wafer W between the modules of the unit shelf U7 and the exposure apparatus C4. The wafer transfer unit 16 and the wafer transfer unit 12 (in the carrier block C1) have approximately the same structure as those of the wafer transfer units A1 to A4 disposed in the respective processing blocks B1 to B4, but the former differs from the latter in the shape of the arm and the number of the arm. As shown in FIG. 1, guides 51 of the wafer transfer units 12 and 16 horizontally extend in a direction perpendicular to the guide 51 of the wafer transfer units A1 to A4. The exposure apparatus C4 performs, for example, an immersion exposure by which a wafer W is exposed while a liquid film is being formed on the surface of the wafer W.

The coating and developing apparatus 1 is equipped with a controller 1A comprising a computer. The controller 1A includes a program, a memory, a data processing part comprising a CPU, and so on. The program incorporates commands (respective steps) in order that control signals are sent from the controller 1A to the respective component members of the coating and developing apparatus 1 so that series of process steps are performed. Based on the control signals, operations of the not-shown driving mechanisms for driving the arms 55, the frame 52, the elevating table 53, and the rotating table 54 are controlled, whereby a wafer W is transferred as described below. In addition, the memory includes an area in which values of process parameters such as a process temperature, a process period, supply rates of chemical liquids, and a power, are stored. When the CPU executes the respective commands of the program, these process parameters are read out, and control signals corresponding to the parameter values are sent to the respective component members of the coating and developing apparatus 1. The program (including a program for input operations and display of the process parameters) is stored in a storage medium such as a flexible disc, a compact disc, a hard disc, an MO (magnetoptical disc), or a memory card, and is installed in the controller 1A.

Figure 6:
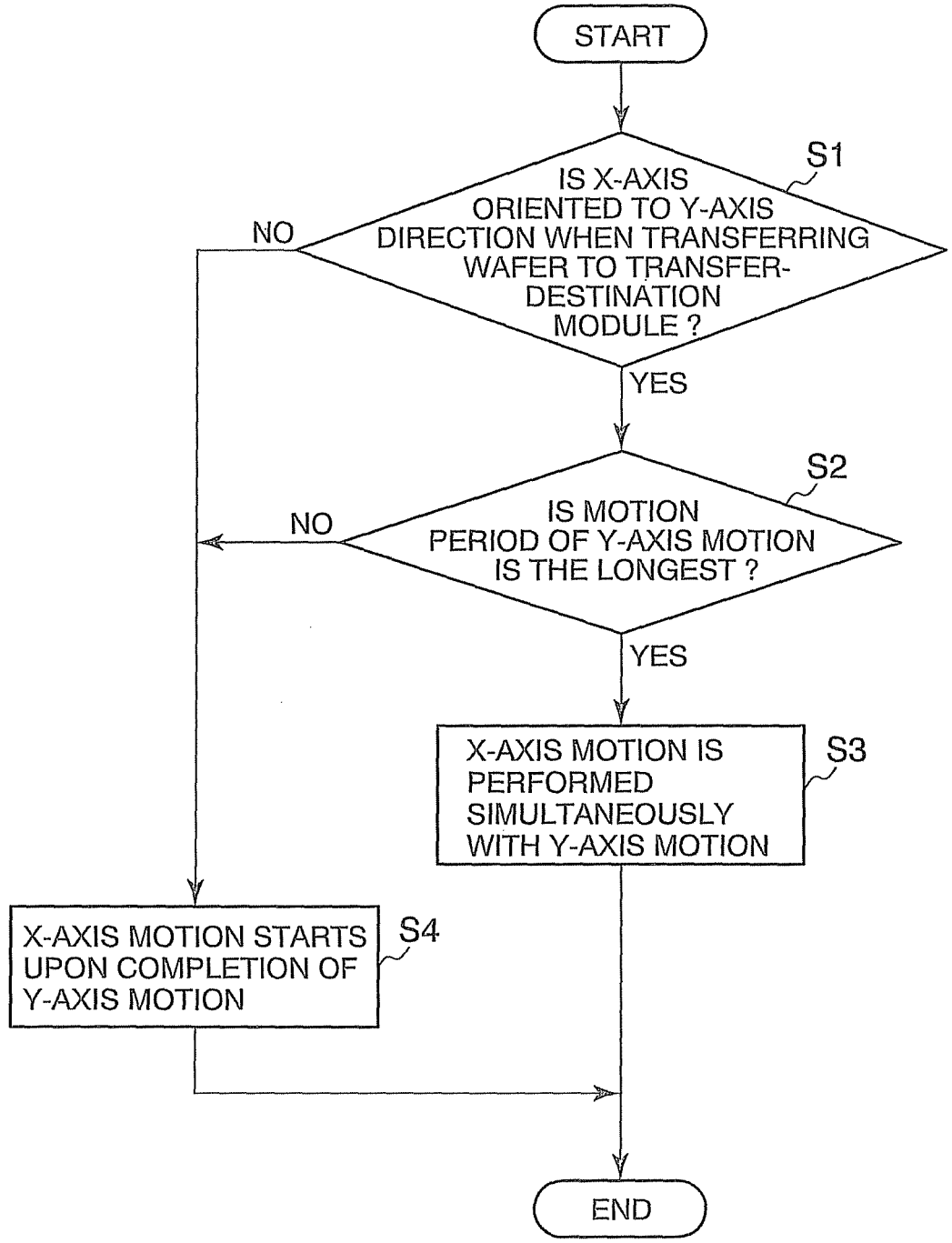
FIG. 6 is a flowchart showing judgments performed by a controller of the coating and developing apparatus.

When a wafer W is transferred between the modules, the controller 1A carries out judgments shown in FIG. 6, thereby to control the motions (operations) of the wafer transfer unit.

At first, the controller 1A judges whether or not the direction of the motion of the arm 55 (X-axis motion) along which the arm 55 enters the transfer-destination module is the same as the direction of the horizontal motion (Y-axis motion) of the arm 55 from the transfer-departure module to the transfer-destination module (step S1). In detail, taking the operation of the wafer transfer unit A4 shown in FIG. 5 as an example, it is judged whether (a) the direction of the horizontal motion (Y-axis motion) of the moving part 50 for the intermodular travel by which the moving part 50 is moved from a position in front of the transfer-departure module to a position in front of the transfer-destination module is the same as (b) the direction of the wafer (substrate) transfer motion (X-axis motion) by which the arm 55 is entered the transfer-destination module. It should be noted that, in the example, the direction of the X-axis motion is depends on the status of θ-axis (i.e., orientation of the rotating table 54) while the direction of the Y-axis motion (along the guide 51) is fixed, and thus the judgment result depends on the position of the transfer-destination module.

If the judgment result in step S1 is YES, then the controller 1A judges whether or not the time required for the Y-axis motion is longer than any of the times required for the motions of the other axes (i.e., Z-axis and θ-axis), during the intermodular travel (step S2). It should be noted that: the wafer transfer unit A4 shown in FIG. 5 performs the intermodular travel by the combination of the Y-axis motion (horizontal motion of frame 52), the Z-axis motion (vertical motion of elevating table 53) and the θ-axis motion (rotating motion of the rotating table 54); and the times required for the respective motions are determined on condition that the respective axes are operated at their maximum speeds.

If the judgment result in step S2 is YES, the controller 1A determined that the Y-axis motion (for intermodular travel of the moving part 50) and the X-axis motion (i.e., wafer transfer motion of the arm 55 for entering the transfer-destination module) should be performed simultaneously (step S3). In this case, the controller 1A determines the axis which requires the second longest time to complete the motion thereof; and after completion of the motion of that axis thus determined, the controller 1A starts the X-axis motion. If the judgment result in step S1 is NO or if judgment result in step S2 is NO, the X-axis motion is started after completion of intermodular travel of the moving part 50.

The wafer transfer route in this embodiment is described. The carrier 10 containing wafers W is placed on the stage 11, and a wafer W in the carrier 10 is taken out of the carrier 10 by the wafer transfer unit 12 and is conveyed to one of the transfer modules CPL1 to CPL3 in the unit shelf U6 located at the same level as the second block (BCT layer) B2. Thereafter, the wafer W received in one of the transfer modules CPL1 to CPL3 is transferred by the wafer transfer unit A2 to one of the hydrophobing modules ADH1 to ADH3 of the unit shelf U7, in which the surface of the wafer W is made hydrophobic.

After the hydrophobing process, the wafer W is transferred, in the following order, to: the wafer transfer unit D2; one of the transfer modules CPL4 and CPL5 of the unit shelf U7 located at the same height position as the COT layer B3; the wafer transfer unit A3; and one of the resist coating modules (COTs) 31a to 31d, whereby a resist is applied onto the surface of the wafer W to form a resist film.

Thereafter, the wafer W is transferred, in the following order, to: the wafer transfer unit A3; one of the heating modules (HPs) 32a to 32j; the wafer transfer unit A3; one of the transfer modules CPL6 to CPL8 of the unit shelf U6; the wafer transfer unit D1; the buffer module BU1 located at the same level as the ITC layer 134; the wafer transfer unit A4; one of the transfer modules CPL9 to CPL11 of the unit shelf U7; the wafer transfer unit A4; and one of the chemical-liquid coating modules (ITCs) 41a to 41d, whereby a chemical liquid is applied onto the surface of the wafer W to form a protective film. Thereafter, the wafer W is transferred, in the following order, to: the wafer transfer unit A4: one of the heating modules (HPs) 42a to 42j; the wafer transfer unit A4, and one of the transfer modules TRS1 and TRS2 of the unit shelf U6.

Thereafter, the wafer W is transferred to the wafer transfer unit D1 and then to the shuttle 13 located on the transfer part 14. The wafer W is then conveyed to the transfer part 15 by the shuttle and then is transferred to the wafer transfer unit 16 of the interface block C3. Thereafter, the wafer W is transferred to the exposure apparatus C4, and is subjected to an immersion exposure process. After that, the wafer W is transferred by the wafer transfer unit 16 from the exposure apparatus C4 to one of the transfer modules CPL12 to CPL14 of the unit shelf U7 located at the same level as the DEV layer 131. Then, the wafer W is transferred by the wafer transfer unit A1 to one of the heating modules (PEBs) 62a to 62i, and then to one of the developing modules (DEVs) 61a to 61h, whereby a developer is supplied to the surface of the wafer W to develop the wafer W. After that, the wafer W is transferred by the wafer transfer unit A1 to one of the heating modules (POSTs) 63a to 63f in which the wafer W is baked. Following thereto, the wafer W is transferred by the wafer transfer unit A1 to one of the transfer modules CPL15 and CPL16 of the unit shelf U6, and is returned to the carrier 10 by the wafer transfer unit 12.

In the aforementioned transfer route, in a case where the wafer W is transferred by one of the wafer transfer units A1 to A4, if the transfer-destination module is one of the modules in the unit shelves U6 and U7, the judgment result of the step S1 is YES. In such a wafer transfer operation between modules, if the judgment result of the step S2 is YES, the Y-axis motion of the moving part 50 and the X-axis motion of the arm 55 are simultaneously performed. Hereinafter, the manner in which the wafer is transferred from the transfer module CPL1 to the hydrophobing module ADH1 is described, as a typical example of the wafer transfer operation including the aforementioned simultaneous motions, is described with reference to FIGS. 7 to 9.

Figure 7:
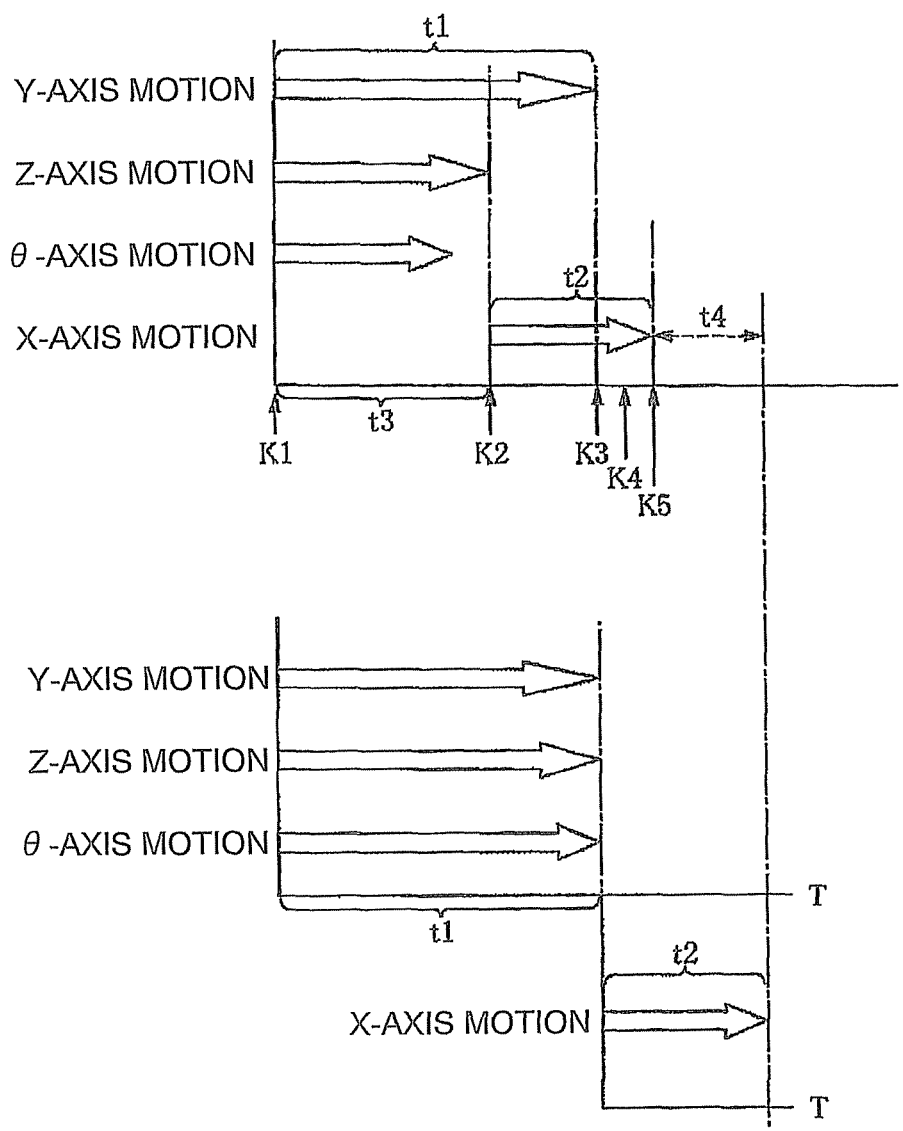
FIG. 7 is a graph showing operations of respective motion axes of the substrate transfer apparatus.
Figure 8:
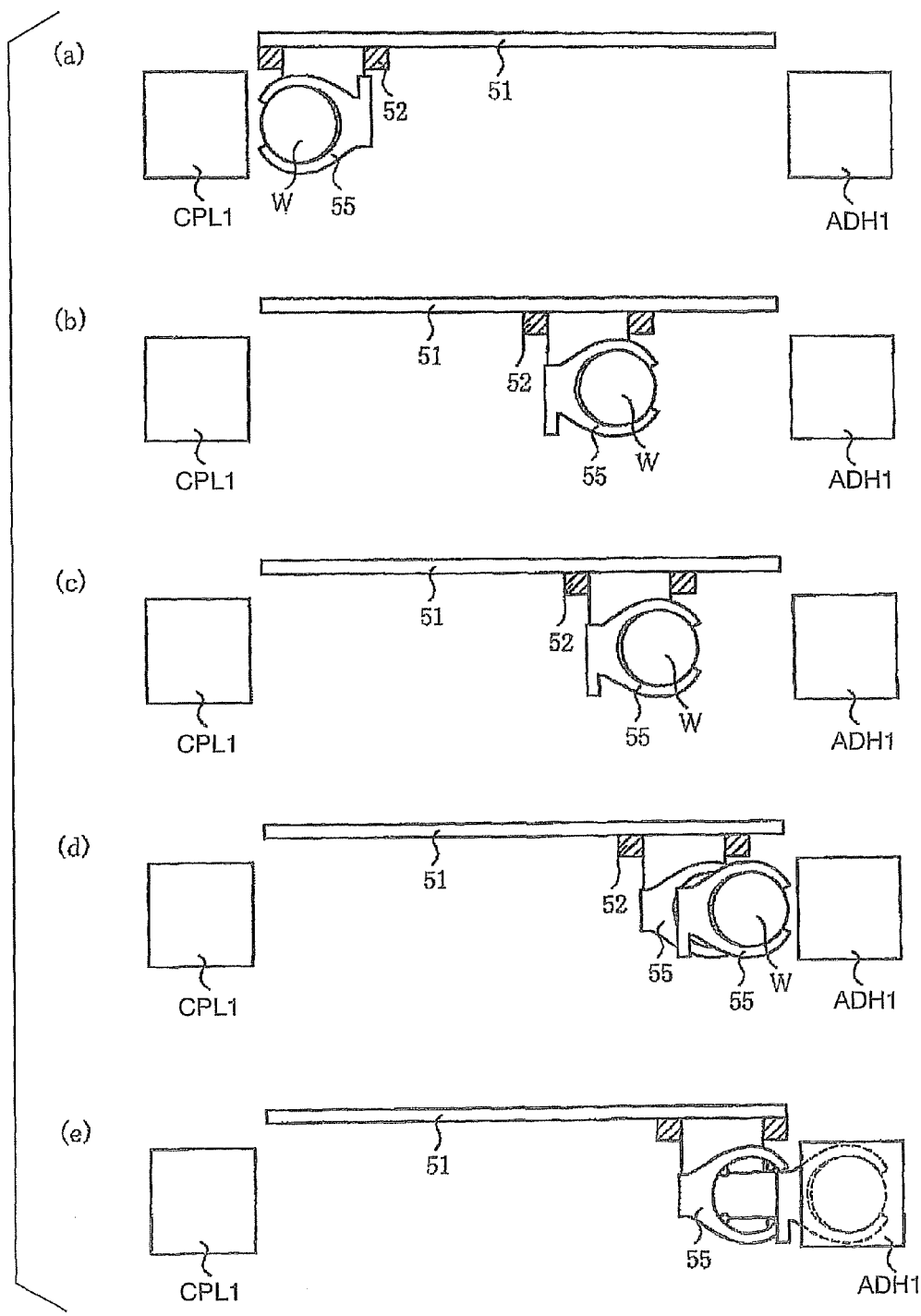
FIGS. 8 (a)-(e) are views showing transfer steps performed by the substrate transfer apparatus.
Figure 9:
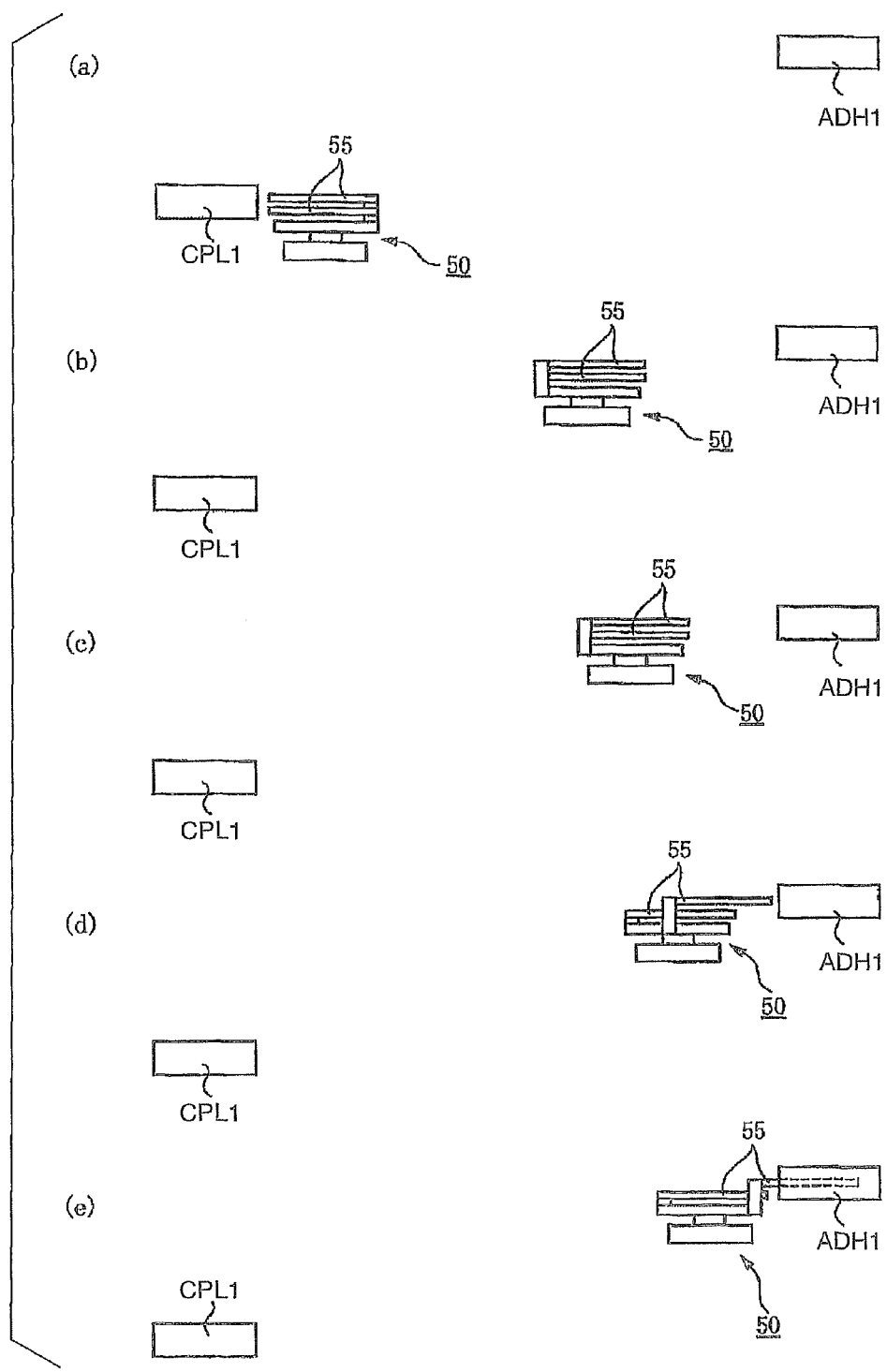
FIGS. 9 (a)-(e) are views showing transfer steps performed by the substrate transfer apparatus.

The abscissa axis of the graph in FIG. 7 shows time passage. The graph of FIG. 7 shows the status of the respective axes, from the time point when the moving part 50 is located in front of the transfer 1 module CPL1 and the arm 55 having received the wafer W from the transfer module CPL1 is in its retracted position, to the time point when the moving part 50 is located in front of the hydrophobing module ADH1 and the arm 55 is moved to its advanced position to enter the hydrophobing module ADH1. White arrows indicate the motions of the respective axes. The left-handed end of each white arrow corresponds to the time point when the motion of the corresponding axis starts, and the right-handed end of each white arrow corresponds to the time point when the motion of the corresponding axis is finished. Each axis is continuously operated throughout the length of the white arrow. The upper portion of the graph of FIG. 7 shows the operation in which the Y-axis motion of the moving part 50 and the X-axis motion of the arm 55 are simultaneously performed (in other words, the motion periods of the Y-axis motion and the X-axis motion overlap), while the lower portion of the graph shows the operation in which motion periods of the Y-axis motion and the X-axis motion do not overlap (which is described in the BACKGROUND ART part of this specification). (a) to (e) of FIG. 8 show the positions of the moving part 50 and the arm 55, in plan view, at time points K1 to K5, respectively, shown in FIG. 7; (a) to (e) of FIG. 9 show the positions (vertical positions) of the moving part and the arm 55, in side view at the time points K1 to K5, respectively. In this example, as shown in FIG. 7, the motion period of the Z-axis motion (vertical motion of the elevating table 53) is the second longest next to the motion period of the Y-axis motion (horizontal motion of the frame 52). The motion period of the Z-axis motion is represented by "t3".

The arm 55 moves to its advanced position with respect to the rotating table 54 to enter the transfer module CPL1, receives the wafer W from the transfer module CPL1, and moves to its retracted position to be withdrawn from the transfer module CPL1. The status at the time point (K1) just when the withdrawal of the arm 55 (back to its retracted position) is completed is shown in FIGS. 8(a) and 9(a). Thereafter, the horizontal motion (Y-axis motion) of the frame 52 toward the hydrophobing module ADH1 along the transfer area R1, the upward (vertical) motion (Z-axis motion) of the elevating table 53 toward the hydrophobing module ADH1, and the rotating motion (θ-axis motion) of the rotating table 54 for changing the direction of the arm 55 from a direction facing the transfer module CPL 1 to a direction facing the hydrophobing module ADH1 are started at the same time, and those motions are performed at their maximum possible speeds (from time point K1 to K2). As shown in FIGS. 8(b) and 9(b), the rotating motion of the rotating table 54 is finished, while the frame 52 and the elevating table 53 are moved continuously. Then, as shown in FIGS. 8(c) and 9(c), the motion of the elevating table 53 is finished (time point K2).

While the frame 52 is being moved, the advancing motion of the arm 55 (X-axis motion) toward the hydrophobing module ADH1 is started. As shown in FIGS. 8(d) and 9(d), the motion of the frame 52 and the advancing motion of the arm 55 toward the hydrophobing module ADH1 are continued (time points K2 to K3). Then, as shown in FIGS. 8(e) and 9(e), the motion of the frame 52 is finished so that the moving part 50 is located in front of the hydrophobing module ADH1, and the arm 55 enters the hydrophobing module ADH1 (time points K4 to K5). After that, the elevating pins (not shown) provided in the hydrophobing module ADH1 are moved upward to support the rear surface of the wafer W, whereby the wafer W is transferred to the hydrophobing module ADH1.

The transfer principle may be summarized as follows:
all the motions other than the substrate transfer motion (i.e., X-axis motion of the arm) are performed at the maximum speeds;
the advancing motion of the arm 55 is started after the situation, where the advancing motion of the arm 55 will not result in collision of the wafer W or the arm 55 with the modules surrounding the transfer area R1, has been established; and
the motion period during which the moving part 50 is performing horizontal motion (Y-axis motion) and the motion period during which the arm 55 moves from its retracted position to its advanced position overlap.

Due to the transfer operation in the above manner, the time required for the intermodular travel and the substrate transfer motion may be the sum (t2+t3) of the time (t2) required for the Z-axis motion (elevating table 53) and the time (t3) required for the X-axis motion (arm 55).

Since the time t1 required for the Y-axis motion (horizontal motion of the frame 52) is longer than the time t3 required for the Z-axis motion (vertical motion of the elevating table), the total time required for the transferring of the wafer W can be reduced by a time t4, which is equivalent to the difference between the time t3, and the time t3, as compared with the case where the advancing motion of the arm starts after completion of the intermodular travel. This may result in improvement of the system throughput.

After the wafer W is transferred from the arm 55 to the hydrophobing module ADH1, the moving part 50 moves away from the hydrophobing module ADH1 along the transfer area R1 to receive another wafer W from the transfer module CPL1. At this time, the movement of the moving part 50 along the transfer area R1 (Y-axis motion) and the retracting motion of the arm 55 (X-axis motion) are simultaneously performed. Namely, the arm 55 and the moving part 50 are operated in the order opposite to that for loading of the wafer W into the hydrophobing module ADH1, and are returned to the position in front of the transfer module CPL1. When the moving part 50 and the arm 55 are moved toward the transfer module CPL1, the advancing motion (X-axis motion) of the arm 55 toward the transfer module CPL1 may be performed during the movement of the moving part 50 along the transfer area R1.

In the above example, the transfer module CPL1 and the hydrophobing module ADH1 are disposed on the opposite ends of the BCT layer 132 of the processing block C2. Thus, it takes relatively long time for the Y-axis motion of the wafer transfer unit A2. Accordingly, the transfer time may be remarkably reduced if the X-axis motion of the arm 55 is performed simultaneously with the Y-axis motion of the moving part 50.

Similarly, in a case where a wafer W is transferred from the buffer module BU1 to one of the transfer modules CPL9 to CPL11 in the ITC layer 64, and in a case where a wafer W is transferred from the transfer module CPL2 or CPL3 to one of the hydrophobing modules ADH1 to ADH3 in the BCT layer 132, the transfer-departure module and the transfer-destination module are located on the opposite ends of the processing block C2, and thus it takes relatively long time for the Y-axis motions of the wafer transfer units A2 and A4. Accordingly, the foregoing transfer method is effective in remarkably reducing the transfer time.

The foregoing transfer principle is applicable if the direction of the X-axis motion (advancing motion) of the arm 55 for entering the transfer-destination module is parallel to the Y-axis motion. Accordingly, the foregoing transfer principle is applicable to a case where a wafer W is transferred by the wafer transfer unit (A1-A4) from a module in any one of the unit shelves U1 to U5 to a module in the unit shelf U6 or U7, and also applicable to a case where a wafer W is transferred by the wafer transfer unit (A1-A4) from a module in the liquid processing part to a module in the unit shelf U6 or U7. Of course, the foregoing transfer principle is applicable to a case where a wafer W is transferred between a module in the unit shelf U6 and a module in the unit shelf U7.

In the above example shown in FIG. 7, the motion period of the elevating table 53 (Z-axis motion) is longer than the motion period of the rotating table 54 (θ-axis motion). Meanwhile, FIG. 10(a) shows an example in which the motion period of θ-axis motion is longer than the motion period of the Z-axis motion. In this case, the X-axis motion is started at the time point when the θ-axis motion is finished after the Z-axis motion has been finished. If the wafer transfer unit A4 is controlled in this manner, the time required for the intermodular travel and the wafer transfer motion is the sum of time t5 and time t2, where time t5 is motion period of the θ-axis motion (the time required for complete the θ-axis motion when the θ-axis is operated at its maximum possible speed). Thus, as compared with the case in which the advancing motion (X-axis motion) of the arm 55 starts after completion of the intermodular travel, the time required for the wafer transfer may be reduced by a difference between the time t5 and the time t1 (t1 is the motion period of the Y-axis motion).

In the above case where the motion period of the θ-axis motion is longer than the motion period of the Z-axis motion, the following control is also possible. Namely, as shown in FIG. 10(b), the X-axis motion may be started in the course of the θ-axis motion after the Z-axis motion has been finished, as long as the arm 55 and the wafer W do not collide with the modules surrounding the transfer area R1.

Alternatively, when the motion period of the Z-axis motion is longer than the motion period of the θ-axis motion, which is shown in FIG. 7, the X-axis motion may be started in the course of the Z-axis motion after the θ-axis motion has been finished, as long as the arm 55 and the wafer W do no collide with the modules surrounding the transfer area R1.

Alternatively, the X-axis motion may be started in the course of the Z-axis motion and the θ-axis motion, as long as the arm 55 and the wafer W do not collide with the modules surrounding the transfer area R1.

Figure 10:
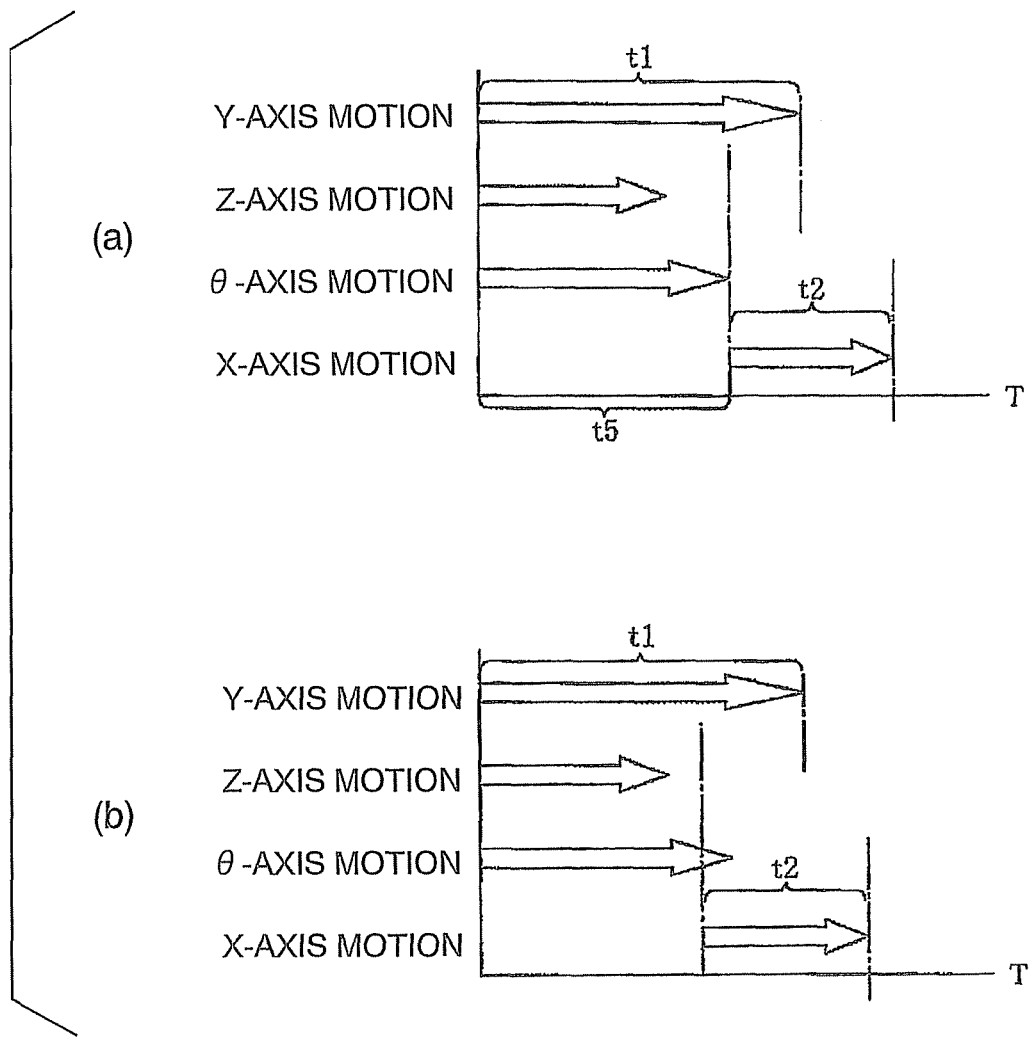
FIGS. 10 (a)-(b) are graphs showing another example of operations of the respective motion axes of the substrate transfer apparatus.

By simultaneously performing the intermodular travel and the substrate transfer motion (X-axis motion) as shown in FIGS. 7 and 10, the time required for wafer transfer can be reduced at most by time t2 required for the X-axis motion, as compared with the case in which the substrate transfer motion is started after completion of the intermodular travel.

The advantageous effect is obtained by the fact that the motion periods of the Y-axis motion and the X-axis motion overlap. Thus, in the example shown in FIG. 7, the X-axis motion may be started after a certain time has elapsed after completion of the Z-axis motion. Also, in the example shown in FIG. 10, the X-axis motion may be started after a certain time has elapsed after completion of the θ-axis motion.

Second Embodiment

Figure 11:
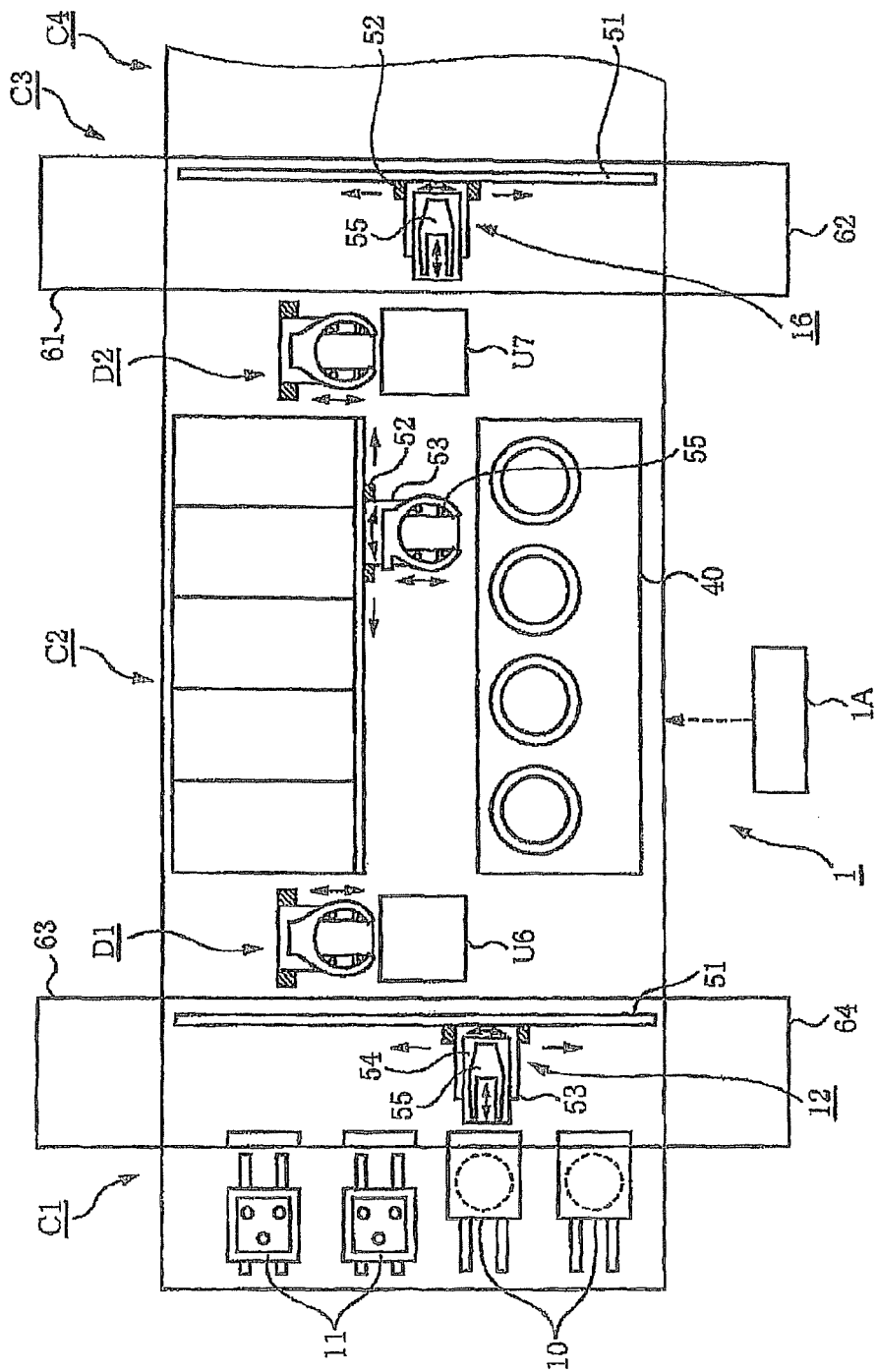
FIG. 11 is a plan view showing an example of another coating and developing apparatus.

Referring to FIG. 11, as viewed from a carrier block C1 toward an exposure apparatus C4, modules 61 and 62 are disposed on the left end and the right end of the interface block C3, respectively, and modules 63 and 64 are disposed on the left end and the right end of the carrier block C1, respectively. The modules 61 and 62 on the interface block C3 are each constituted as an inspection module, one being configured to inspect the thickness of a film formed on the surface of a wafer before exposure, and the other being configured to inspect the number of particles on the wafer W before exposed. The modules 63 and 64 disposed on the carrier block C1 are each constituted as an inspection module, one being configured to inspect the line width of a resist pattern of a developed wafer W, and the other being configured to inspect the number of particles on the wafer W.

The differences between the transfer route in the coating and developing apparatus 1 in the second embodiment shown in FIG. 11 and the transfer route previously described in connection with the first embodiment are as follows: A wafer W, which has been conveyed from a processing block C2 to a wafer transfer unit 16 of the interface block C3, is transferred to the modules 61 and 62 in that order for sequential inspection. Then, the wafer W is transferred to the exposure apparatus C4. The wafer W, which has been developed and conveyed to transfer module CPL15 or CPL16, is transferred by a wafer transfer unit 12 to the modules 63 and 64 in that order for sequential inspection. Then, the wafer W is returned to a carrier C. In this embodiment, when the wafer W is transferred from the module 63 to the module 64, and from the module 61 to the module 62, the direction of the Y-axis motion (which is parallel to the guide 51) and the direction the X-axis motion (advancing motion) of the arm 55 are the same. Thus, the foregoing transfer principle is applicable.

Figure 12:
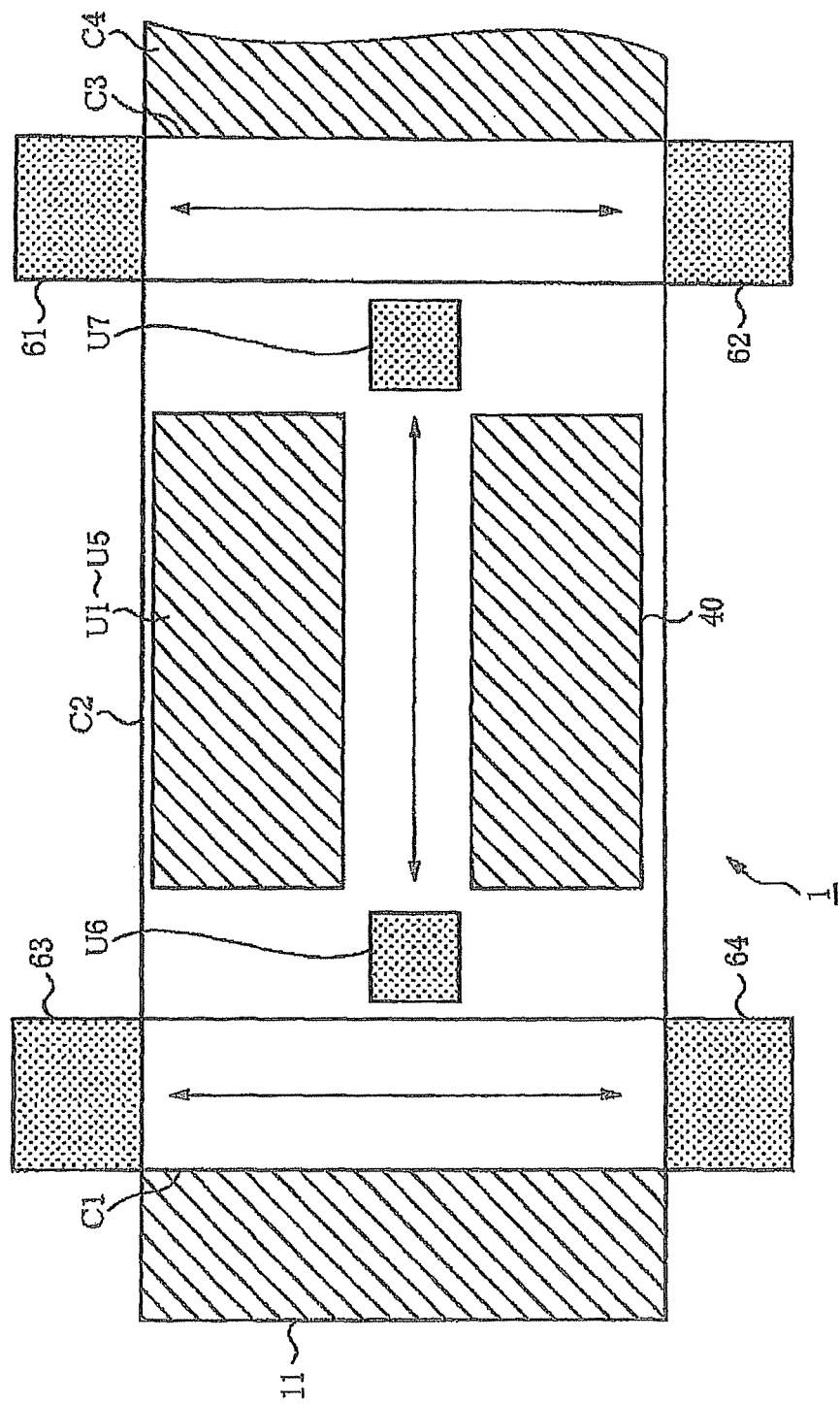
FIG. 12 is a schematic view indicating modules which the transfer principle may be applied.

FIG. 12 corresponds to FIG. 11, and shows that modules with dot-hatch may be transfer-destination modules to which the foregoing transfer principle is applicable, while modules with shade-hatch may be transfer-destination modules to which the foregoing transfer principle is not applicable. If a wafer W is transferred to a transfer-destination module with shade-hatch, the direction of the wafer transfer motion (X-axis motion) of the arm 55 is perpendicular to the direction of the horizontal motion (Y-axis motion) of the wafer transfer unit indicated by arrows. In such a case, the wafer transfer motion is starts after completion of the intermodular travel.

The modules 61 to 64 may be replaced with a certain kind of module other than inspection modules. For example, one of the modules 61 and 62 may be constituted as an edge exposure module configured to expose the peripheral portion of a resist film formed on a wafer. In this case, the inspection may be performed after the peripheral exposure. Similarly, one of the modules 63 and 64 may be constituted as an edge exposure module, and the inspection may be performed after the peripheral exposure, for example.

It should be noted that the aforementioned transfer routes and processes are raised by way of example, and the transfer manner is not limited thereto. Moreover, the shuttle 13 may be provided with a moving part (50) and an arm (55) capable of being horizontally moved, similarly to the wafer transfer unit A4 or 16, and the conveying parts 14 and 15 of the unit shelves U6 and U7 may be constituted as transfer modules configured for transferring of a wafer W between the conveying parts (14, 15) and the wafer transfer units (D1, 16). In this case, the shuttle 13 may transfer a wafer from the transfer part 14 to the transfer part 15 using the foregoing transfer principle.

Figure 13:
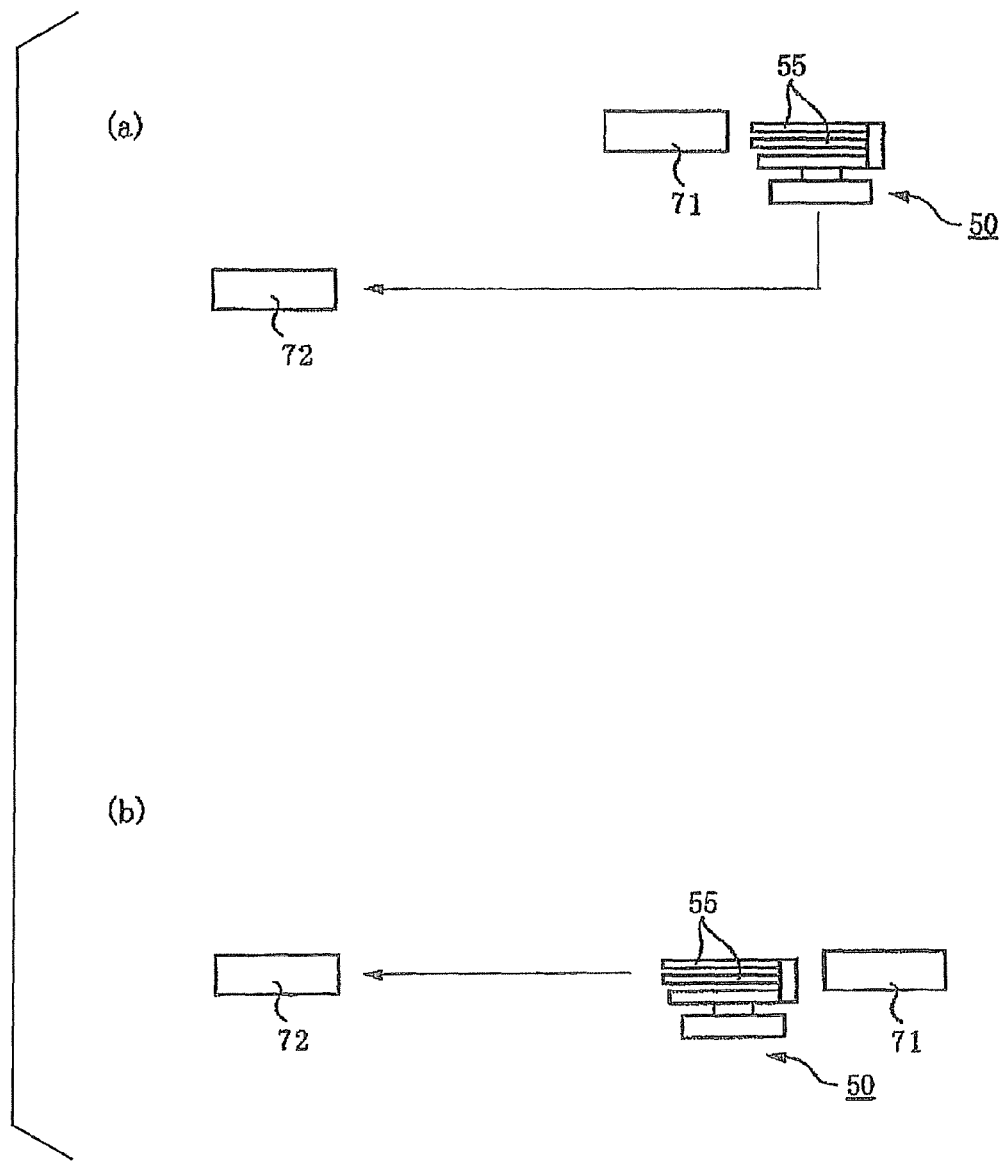
FIGS. 13 (a)-(b) are side views showing a layout of modules.
Figure 14:
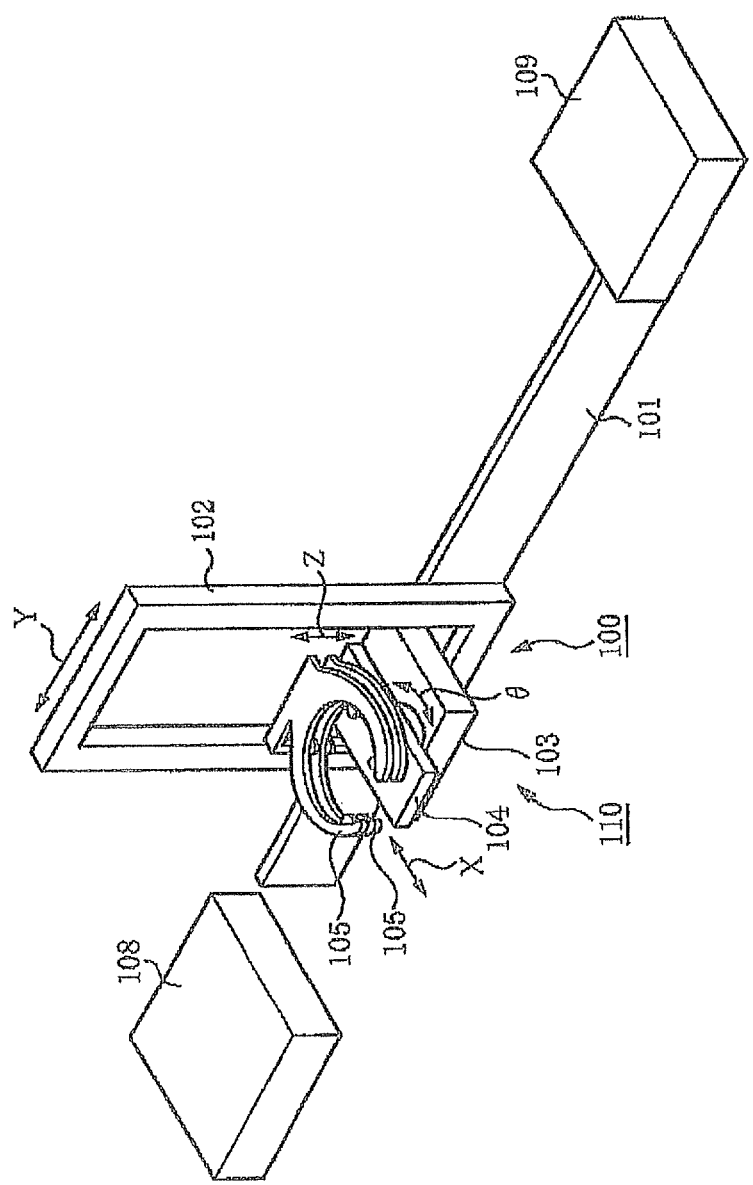
FIG. 14 is a perspective view of a conventional substrate transfer apparatus.
Figure 15:
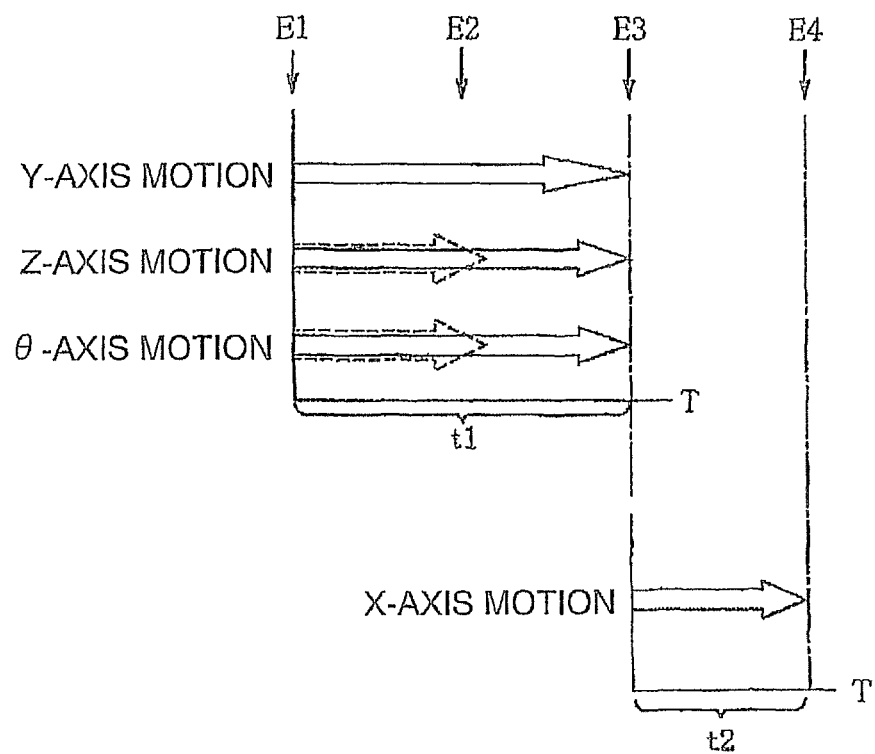
FIG. 15 is a graph explaining conventional operations of respective motion axes performed by the substrate transfer apparatus.
Figure 16:
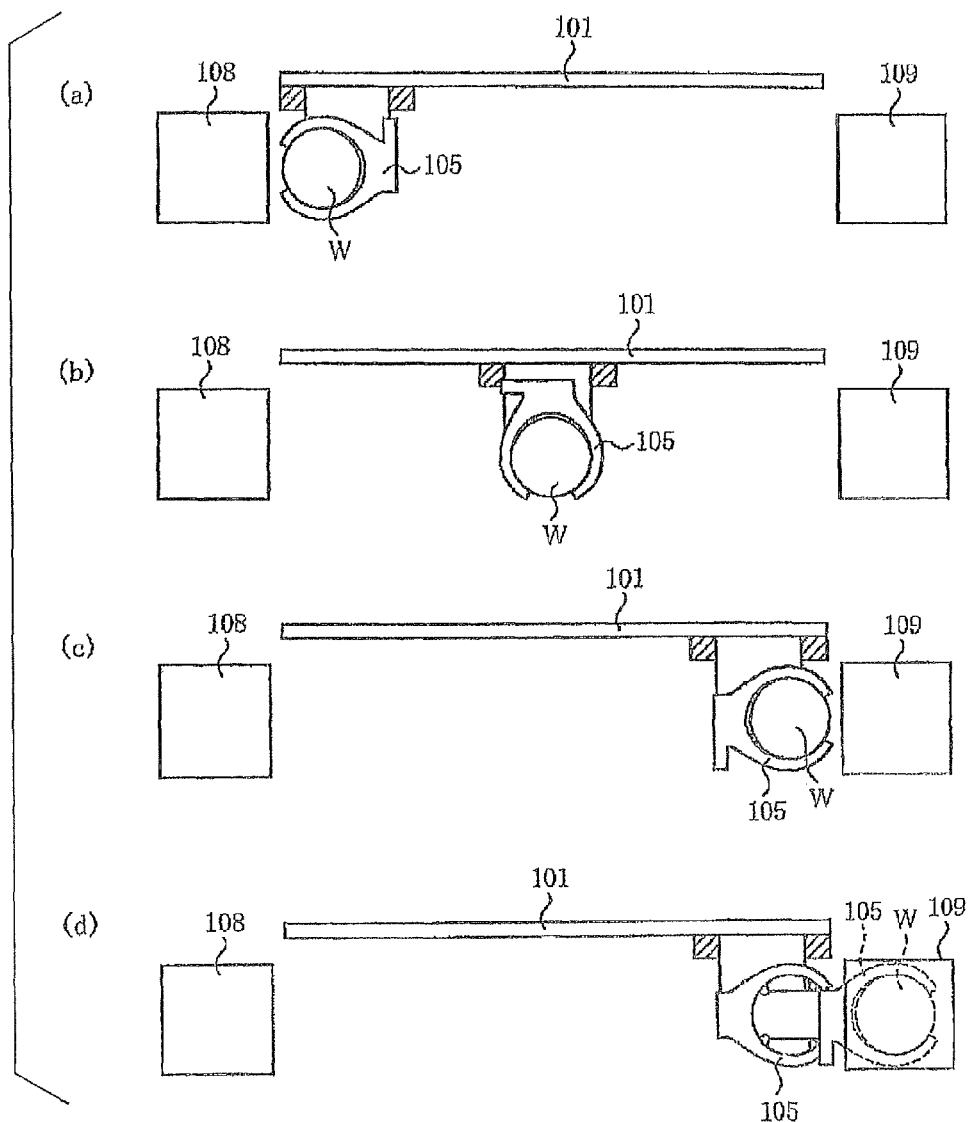
FIGS. 16 (a)-(d) are plan views showing conventional transfer steps performed by the substrate transfer apparatus.
Figure 17:
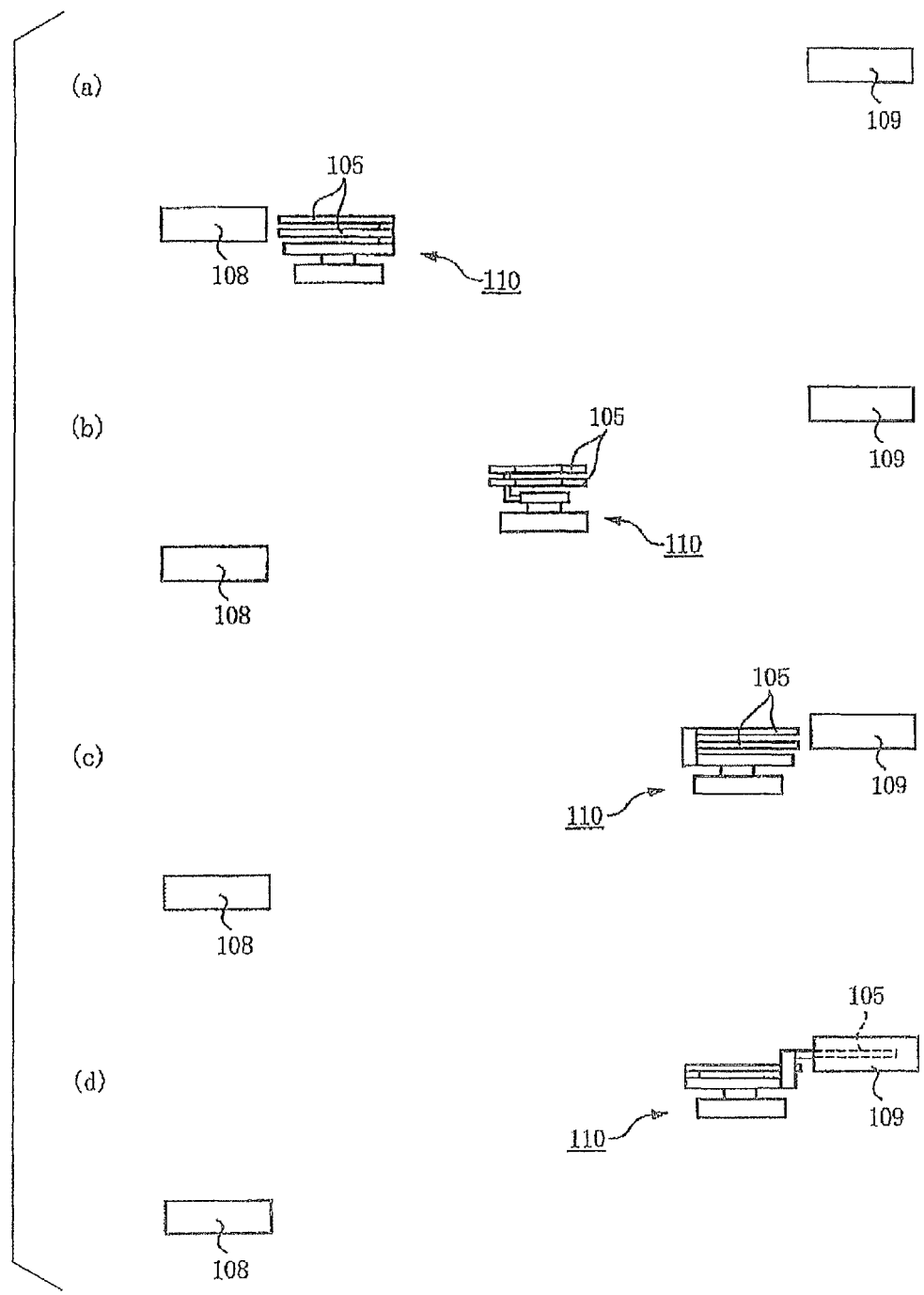
FIGS. 17 (a)-(d) are side views showing conventional transfer steps performed by the substrate transfer apparatus.

In the above example, the moving part 50 is configured to move the arm 55 both for rotation (θ-axis motion) and vertical motion (Z-axis motion). However, it is not necessary for the moving part 50 to have both the rotating means for rotating the arm 55 and the elevating means for vertically moving the arm 55. For example, as shown in FIG. 13(*a*), if the modules 71 and 72 (which may be a transfer-departure module and a transfer-destination module and vice versa) are located at different levels but are oriented the same direction, the rotating means may be omitted. Alternatively, as shown in FIG. 13(*b*), if the modules 71 and 72 are oriented different directions but are located at the same level, the elevating means may be omitted. In these cases, the foregoing transfer principle is also applicable.

The invention claimed is:

1. A method of transferring a substrate between a first module and a second module using a substrate transfer apparatus,
   wherein, in plan view, the first and second modules both face a transfer path, the transfer path extends substantially linearly in a Y-direction, and the second module is located on an imaginary extension in the Y-direction of the transfer path, and
   wherein the substrate transfer apparatus includes: a moving base having a horizontal, Y-motion axis for moving the moving base in the Y-direction; and a substrate holding member mounted to the moving base via a horizontal, X-motion axis so as to move relative to the moving base to be in an advanced position and a retracted position relative to the moving base, via a θ-motion axis so as to turn about a vertical axis relative to the moving base, and via a Z-motion axis so at to move vertically relative to the moving base,
   said method comprising:
   transferring a substrate from the first module to the substrate holding member;
   moving the moving base toward the second module by operating the Y-motion axis;
   advancing the substrate holding member relative to the moving base by operating the X-motion axis, in order to place the holding member in the advanced position; and
   turning the substrate holding member by operating the θ-motion axis to direct the X-motion axis in the Y-direction so as to orient the substrate holding member toward the second module if the first module and the second module are oriented to different directions;
   vertically moving the substrate holding member by operating the Z-motion axis to position the substrate holding member at a level of the second module, if the first module and the second module are located at different levels;
   judging whether a Y-motion axis operating time is longer than a longer one of a θ-motion axis operating time and a Z-motion axis operating time;
   wherein if the Y-motion axis operating time is judged to be longer than the longer one of the θ-motion axis operating time and the Z-motion axis operating time, initiating the advancing of the substrate holding member by the X-motion axis upon completion of an operation of one of the θ-motion axis or the Z-motion axis having the longer operating time so that the X-motion axis operating time overlaps with the Y-motion axis operating time, and
   if the Y-motion axis operating time is judged to be not longer than the longer one of the θ-motion axis operating time and the Z-motion axis operating time, initiating the advancing of the substrate holding member by the X-motion axis after completion of an operation of the Y-motion axis so that the X-motion axis operating time does not overlap with the Y-motion axis operating time, and
   transferring the substrate from the substrate holding member placed in the advanced position to the second module with the X-motion axis and the Y-motion axis being parallel with each other.

2. The method according to claim 1,
   wherein the
   turning the substrate holding member by operating the θ-motion axis after the transferring of the substrate from the first module to the holding member, to orient the X-motion axis parallel to the Y-motion axis.

3. The method according to claim 2, wherein the advancing of the holding member relative to the moving base by operating the X-motion axis is performed after completion of the turning of the substrate holding member by operating the θ-motion axis.

4. The method according to claim 1,
   wherein the advancing of the holding member relative to the moving base by operating the X-motion axis is performed after the later one of completion of turning the substrate holding member by the θ-motion axis and completion of the vertical moving of the substrate holding member by the Z-motion axis.

5. A non-transitory storage medium storing a computer program for controlling a substrate apparatus, the computer program on the non-transient storage medium comprising instructions for:
   transferring a substrate from a first module to a holding member, the holding member mounted on a moving base via a horizontal, X-motion axis so as to move relative to the moving base to be in an advanced position and a retracted position relative to the moving base, via a θ-motion axis so as to turn about a vertical axis relative to the moving base, and via a Z-motion axis so at to move vertically relative to the moving base;
   moving the moving base having a horizontal, Y-motion axis for moving the moving base in the Y-direction along a transfer path toward a second module by operating in the Y-motion axis, wherein, when in plan view, the first and second modules both face a transfer path, the transfer path extends substantially linearly in Y-direction, and the second module is located on an imaginary extension in the Y-direction of the transfer path; and
   when the moving base is moving toward the second module by operating in the Y-motion axis after transferring the substrate from the first module to the holding member:
   advancing the holding member relative to the moving base by operating the X-motion axis to place the holding member in the advanced position;

turning the substrate holding member by operating the θ-motion axis to direct the X-motion axis in the Y-direction to orient the substrate holding member toward the second module when the first module and the second module are oriented in different directions;

moving the substrate holding member vertically by operating the Z-motion axis to position the substrate holding member at a level of the second module, when the first module and the second module are located at different levels;

judging whether a Y-motion axis operating time is longer than a longer one of a θ-motion axis operating time and a Z-motion axis operating time, and if the Y-motion axis operating time is judged to be longer than the longer one of the θ-motion axis operating time and the Z-motion axis operating time, initiating the advancing of the substrate holding member by the X-motion axis upon completion of an operation of one of the θ-motion axis or the Z-motion axis having the longer operating time so that the X-motion axis operating time overlaps with the Y-motion axis operating time, and if the Y-motion axis operating time is judged to be not longer than the longer one of the θ-motion axis operating time and the Z-motion axis operating time, initiating the advancing of the substrate holding member by the X-motion axis after completion of an operation of the Y-motion axis so that the X-motion axis operating time does not overlap with the Y-motion axis operating time; and transferring the substrate from the substrate holding member placed in the advanced position to the second module, with the X-motion axis and the Y-motion axis being parallel with each other.

6. A non-transitory storage medium storing a computer program for controlling a substrate apparatus, the computer program on the non-transient storage medium comprising instructions for:

transferring a substrate from a first module to a holding member, the holding member mounted on a moving base via a horizontal, X-motion axis so as to move relative to the moving base to be in an advanced position and a retracted position relative to the moving base, via a θ-motion axis so as to turn about a vertical axis relative to the moving base, and via a Z-motion axis so at to move vertically relative to the moving base;

moving the moving base having a horizontal, Y-motion axis for moving the moving base in the Y-direction along a transfer path toward a second module by operating in the Y-motion axis, wherein, when in plan view, the first and second modules both face a transfer path, the transfer path extends substantially linearly in Y-direction, and the second module is located on an imaginary extension in the Y-direction of the transfer path; and when the moving base is moving toward the second module by operating in the Y-motion axis after transferring the substrate from the first module to the holding member:

advancing the holding member relative to the moving base by operating the X-motion axis to place the holding member in the advanced position;

moving the substrate holding member vertically by operating the Z-motion axis to position the substrate holding member at a level of the second module, when the first module and the second module are located at different levels, and judging whether a Y-motion axis operating time is longer than a longer one of a θ-motion axis operating time and a Z-motion axis operating time, and if the Y-motion axis operating time is judged to be longer than the longer one of the θ-motion axis operating time and the Z-motion axis operating time, initiating the advancing of the substrate holding member by the X-motion axis upon completion of an operation of one of the θ-motion axis or the Z-motion axis having the longer operating time so that the X-motion axis operating time overlaps with the Y-motion axis operating time, and if the Y-motion axis operating time is judged to be not longer than the longer one of the θ-motion axis operating time and the Z-motion axis operating time, initiating the advancing of the substrate holding member by the X-motion axis after completion of an operation of the Y-motion axis so that the X-motion axis operating time does not overlap with the Y-motion axis operating time; and transferring the substrate from the substrate holding member placed in the advanced position to the second module, with the X-motion axis and the Y-motion axis being parallel with each other.

7. A substrate transfer apparatus for transferring a substrate between at least a first module and a second module comprising:

a moving base having a horizontal, Y-motion axis for moving the moving base in the Y-direction along a transfer path;

a holding member for holding a substrate, the holding member mounted on the moving base via a horizontal, X-motion axis so as to move relative to the moving base to be in an advanced position and a retracted position relative to the moving base, via a θ-motion axis so as to turn about a vertical axis relative to the moving base, and via a Z-motion axis so at to move vertically relative to the moving base; and a controller for controlling movement of the substrate transfer apparatus;

wherein, when in plan view, the first and second modules both face a transfer path, the transfer path extends substantially linearly in Y-direction, and the second module is located on an imaginary extension in the Y-direction of the transfer path, wherein when the moving base is moving toward the second module by operating in the Y-motion axis after transferring the substrate from the first module to the holding member, the controller:

advances the holding member relative to the moving base by operating the X-motion axis to place the holding member in the advanced position;

turns the substrate holding member by operating the θ-motion axis to direct the X-motion axis in the Y-direction to orient the substrate holding member toward the second module when the first module and the second module are oriented in different directions;

moves the substrate holding member vertically by operating the Z-motion axis to position the substrate holding member at a level of the second module, when the first module and the second module are located at different levels; and judges whether a Y-motion axis operating time is longer than a longer one of a θ-motion axis operating time and a Z-motion axis operating time, and if the Y-motion axis operating time is judged to be longer than the longer one of the θ-motion axis operating time and the Z-motion axis operating time, initiates the advancing of the substrate holding member by the X-motion axis upon completion of an operation of one of the θ-motion axis or the Z-motion axis having the longer operating time so that the X-motion axis operating time overlaps with the Y-motion axis operating time, and if the Y-motion axis operating time is judged to be not longer than the longer one of the θ-motion axis operating time and the Z-motion axis operating time, initiates the advancing of the substrate holding member by the X-motion axis after completion of an operation of the Y-motion axis so that the X-motion axis operating time does not overlap with the Y-motion axis operating time; and transfers the substrate from the substrate holding member placed in the advanced position to the second module, with the X-motion axis and the Y-motion axis being parallel with each other.

8. A coating and developing apparatus comprising:

a carrier block into which a carrier accommodating a plurality of substrates is loaded;

a processing block connected to the carrier block so as to allow a substrate to be transferred between the processing block and the carrier block, the processing block comprising a plurality of modules including at least coating module for applying a resist to the substrate and a developing module for developing the resist after being exposed;

an interface block for allowing a substrate to be transferred between the processing block and an exposure apparatus, and a substrate transfer apparatus for transferring a substrate between at least the coating module and the developing module comprising:

a moving base having a horizontal, Y-motion axis for moving the moving base in the Y-direction along a transfer path;

a holding member for holding a substrate, the holding member mounted on the moving base via a horizontal, X-motion axis so as to move relative to the moving base to be in an advanced position and a retracted position relative to the moving base, via a θ-motion axis so as to turn about a vertical axis relative to the moving base, and via a Z-motion axis so at to move vertically relative to the moving base; and a controller for controlling movement of the substrate transfer apparatus;

wherein, when in plan view, the coating module and the developing module both face a transfer path, the transfer path extends substantially linearly in Y-direction, and the developing module is located on an imaginary extension in the Y-direction of the transfer path, wherein when the moving base is moving toward the developing module by operating in the Y-motion axis after transferring the substrate from the coating module to the holding member, the controller:

advances the holding member relative to the moving base by operating the X-motion axis to place the holding member in the advanced position;

turns the substrate holding member by operating the θ-motion axis to direct the X-motion axis in the Y-direction to orient the substrate holding member toward the developing module when the coating module and the developing module are oriented in different directions;

moves the substrate holding member vertically by operating the Z-motion axis to position the substrate holding member at a level of the developing module, when the coating module and the developing module are located at different levels; and judges whether a Y-motion axis operating time is longer than a longer one of a θ-motion axis operating time and a Z-motion axis operating time, and if the Y-motion axis operating time is judged to be longer than the longer one of the θ-motion axis operating time and the Z-motion axis operating time, initiates the advancing of the substrate holding member by the X-motion axis upon completion of an operation of one of the θ-motion axis or the Z-motion axis having the longer operating time so that the X-motion axis operating time overlaps with the Y-motion axis operating time, and if the Y-motion axis operating time is judged to be not longer than the longer one of the θ-motion axis operating time and the Z-motion axis operating time, initiates the advancing of the substrate holding member by the X-motion axis after completion of an operation of the Y-motion axis so that the X-motion axis operating time does not overlap with the Y-motion axis operating time; and transfers the substrate from the substrate holding member placed in the advanced position to the developing module, with the X-motion axis and the Y-motion axis being parallel with each other.

* * * * *